US012720747B2

(12) United States Patent
Said et al.

(10) Patent No.: US 12,720,747 B2
(45) Date of Patent: Aug. 25, 2026

(54) THREE-DIMENSIONAL MEMORY DEVICE WITH REDUCED NEIGHBORING WORD LINE INTERFERENCE AND METHODS OF FORMING THE SAME

(71) Applicant: SANDISK TECHNOLOGIES LLC, Addison, TX (US)

(72) Inventors: Ramy Nashed Bassely Said, San Jose, CA (US); Sarath Puthenthermadam, San Jose, CA (US); Jiahui Yuan, San Francisco, CA (US); Raghuveer S. Makala, Campbell, CA (US); Longju Liu, Milpitas, CA (US); Senaka Kanakamedala, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 404 days.

(21) Appl. No.: 18/355,745

(22) Filed: Jul. 20, 2023

(65) Prior Publication Data

US 2024/0237344 A1 Jul. 11, 2024

Related U.S. Application Data

(60) Provisional application No. 63/479,043, filed on Jan. 9, 2023.

(51) Int. Cl.
*H10B 43/27* (2023.01)
*H10B 43/35* (2023.01)

(52) U.S. Cl.
CPC ............ *H10B 43/27* (2023.02); *H10B 43/35* (2023.02)

(58) Field of Classification Search
CPC ......... H10B 43/27; H10B 43/35; H10B 41/27
See application file for complete search history.

(56) References Cited

U.S. PATENT DOCUMENTS

| | | | | |
|---|---|---|---|---|
| 9,576,966 | B1 | 2/2017 | Peri et al. | |
| 9,806,089 | B2 | 10/2017 | Sharangpani et al. | |
| 10,516,025 | B1 | 12/2019 | Nishikawa et al. | |
| 10,580,783 | B2 | 3/2020 | Cui et al. | |
| 10,700,089 | B1 * | 6/2020 | Hojo ...................... | H10B 43/10 |
| 10,707,233 | B1 | 7/2020 | Cui et al. | |
| 10,741,579 | B2 | 8/2020 | Cui et al. | |
| 10,756,106 | B2 | 8/2020 | Nishikawa et al. | |

(Continued)

OTHER PUBLICATIONS

Endoh et al., "Novel Ultra High-Density Memory with a Stacked-Surrounding Gate Transistor (S-SGT) Structured Cell," IEDM Proc. (2001) 33-36.

(Continued)

*Primary Examiner* — Grant Sitta
(74) *Attorney, Agent, or Firm* — THE MARBURY LAW GROUP PLLC

(57) ABSTRACT

A memory device includes an alternating stack of insulating layers and electrically conductive layers, a memory opening vertically extending through the alternating stack, a memory opening fill structure located in the memory opening and containing a memory film and a vertical semiconductor channel; and a neighboring electrically conductive layer interference reduction feature provided for a first subset of the electrically conductive layers, such that a second subset of the electrically conductive layers lacks the neighboring electrically conductive layer interference reduction feature.

4 Claims, 41 Drawing Sheets

(56) References Cited

U.S. PATENT DOCUMENTS 10,818,542 B2 10/2020 Cui et al.
11,049,807 B2 6/2021 Li et al.
11,063,063 B2 7/2021 Zhang et al.
11,101,288 B2 8/2021 Zhang et al.
11,380,707 B2 7/2022 Matsuno et al.
11,387,244 B2 7/2022 Makala et al.
11,482,531 B2 10/2022 Said et al.
11,515,326 B2 11/2022 Cui et al.
11,569,260 B2 1/2023 Rajashekhar et al.
11,631,686 B2 4/2023 Said et al.
11,659,711 B2 5/2023 Kasai et al.
2012/0001252 A1* 1/2012 Alsmeier ............... H10B 43/20 257/E21.679
2015/0357342 A1* 12/2015 Lee ...................... H10D 64/037 257/314
2017/0062330 A1* 3/2017 Kim ....................... H10B 43/27
2018/0138194 A1* 5/2018 Shigemura ............. H10B 43/27
2018/0254247 A1* 9/2018 Kim ....................... H10B 43/10
2019/0139973 A1* 5/2019 Zhou ...................... H10B 41/27
2019/0273088 A1 9/2019 Cui et al.
2020/0343161 A1* 10/2020 Wu ..................... H10W 20/074
2021/0265385 A1 8/2021 Rajashekhar et al.
2021/0327897 A1 10/2021 Kasai et al.
2021/0335805 A1* 10/2021 Kai ...................... H10D 84/038
2021/0335999 A1* 10/2021 Kai ...................... H10D 62/115
2022/0052073 A1 2/2022 Kitazawa et al.
2022/0254797 A1 8/2022 Said et al.
2022/0278216 A1 9/2022 Pitner et al.
2022/0285386 A1 9/2022 Said et al.
2022/0285388 A1 9/2022 Cui et al.

OTHER PUBLICATIONS

Jung, W.J. et al., "Dielectric Engineering to Suppress Cell-to-Cell Programming Voltage Interference in 3D Nand Flash Memory," *Micromachines* 2021, vol. 12, No. 11, 1297, https:/doi.org/10.3390/ml12111297.

U.S. Appl. No. 17/233,799, filed Apr. 19, 2021, SanDisk Technologies LLC.

U.S. Appl. No. 17/662,926, filed May 11, 2022, SanDisk Technologies LLC.

U.S. Appl. No. 17/716,698, filed Apr. 8, 2022, SanDisk Technologies LLC.

U.S. Appl. No. 17/811,145, filed Jul. 7, 2022, SanDisk Technologies LLC.

U.S. Appl. No. 18/351,205, filed Jul. 12, 2023, SanDisk Technologies LLC.

* cited by examiner

32T(32)
42
322
42
322
42
321
42
321
42
321
42
321
42
32B(32)
10
53
52
155

A'
200
100
76
74
80
72
20
58
A 58
63
62
10
32T(32)
42
322
321
32B(32)
52
54
56
50
60
55
60L

THREE-DIMENSIONAL MEMORY DEVICE WITH REDUCED NEIGHBORING WORD LINE INTERFERENCE AND METHODS OF FORMING THE SAME

FIELD

The present disclosure relates generally to the field of semiconductor devices, and particularly to a three-dimensional memory device with reduced neighboring word line interference and methods of forming the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a memory device includes an alternating stack of insulating layers and electrically conductive layers, a memory opening vertically extending through the alternating stack, a memory opening fill structure located in the memory opening and containing a memory film and a vertical semiconductor channel; and a neighboring electrically conductive layer interference reduction feature provided for a first subset of the electrically conductive layers, such that a second subset of the electrically conductive layers lacks the neighboring electrically conductive layer interference reduction feature.

According to another aspect of the present disclosure, a method of forming a memory device is provided, which comprises: forming an alternating stack of insulating layers and sacrificial material layers over a substrate, wherein the insulating layers comprise first-type insulating layers comprising a first insulating material and at least one second-type insulating layer comprising a second insulating material that is different from the first insulating material; forming a memory opening through the alternating stack; forming at least one lateral recess by laterally expanding the memory opening at each level of the at least one second-type insulating layer; forming charge storage material layers in the memory opening, wherein the charge storage material layers are vertically spaced apart from each other within each of the at least one lateral recess; forming a tunneling dielectric layer and a vertical semiconductor channel over the charge storage material layers; and replacing the sacrificial material layers with electrically conductive layers.

According to yet another aspect of the present disclosure, a method of forming a memory device is provided, which comprises: forming an alternating stack of insulating layers and sacrificial material layers over a substrate, wherein the sacrificial material layers comprise first-type sacrificial material layers comprising a first sacrificial material and second-type sacrificial material layers comprising a second sacrificial material that is different from the first sacrificial material; forming a memory opening through the alternating stack; forming lateral recesses by laterally expanding the memory opening at each level of the second-type sacrificial material layers; forming a memory film in the memory opening, wherein the memory film comprises a vertical stack of memory elements that are formed at levels of the first-type sacrificial material layers and the second-type sacrificial material layers; forming a vertical semiconductor channel over the memory film; and replacing each of the sacrificial material layers with electrically conductive layers.

DETAILED DESCRIPTION

Figure 1:
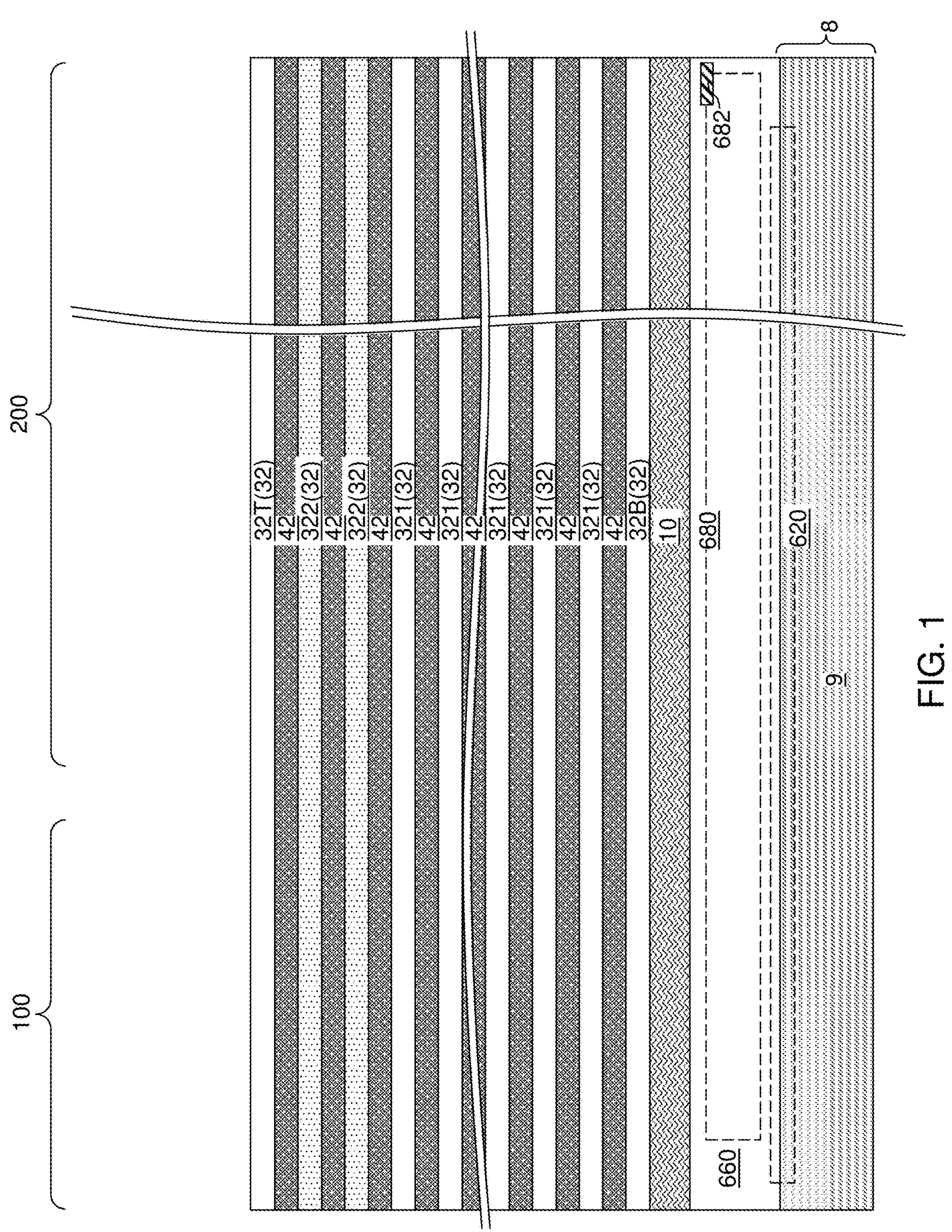
FIG. 1 is a schematic vertical cross-sectional view of a first exemplary structure after formation of optional semiconductor devices, optional lower-level metal interconnect structures, a semiconductor material layer, and an alternating stack of insulating layers and sacrificial material layers according to a first embodiment of the present disclosure.

As discussed above, the present disclosure is directed to a three-dimensional memory device providing reduced neighboring interference and methods of forming the same, the various aspects of which are described below.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^5$ S/cm. As used herein, an "insulator material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^5$ S/cm. A "doped semiconductor material" maybe a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor die, or a semiconductor package, can include a memory chip. Each semiconductor package contains one or more dies (for example one, two, or four). The die is the smallest unit that can independently execute commands or report status. Each die contains one or more planes (e.g., one to four planes). Identical, concurrent operations can take place on each plane, although with some restrictions. Each plane contains a number of blocks, which are the smallest unit that can be erased by in a single erase operation. Each block contains a number of pages, which are the smallest unit that can be programmed.

Referring to FIG. 1, a first exemplary structure according to a first embodiment of the present disclosure is illustrated. The first exemplary structure comprises a substrate 8, which may be a semiconductor substrate, an insulating substrate, a conductive substrate, or a combination thereof. The substrate 8 comprises a substrate material layer 9, which may or may not be a semiconductor material layer. In one embodiment, the substrate 8 may comprise a semiconductor substrate consisting essentially of a single crystalline semiconductor material or a polycrystalline semiconductor material. In one embodiment, the substrate 8 maybe a portion of a commercially available silicon wafer on which a plurality of semiconductor dies, such as a two-dimensional array of semiconductor dies, can be subsequently formed. If the substrate material layer 9 comprises a semiconductor material, then it may comprise a doped well in a silicon wafer or an epitaxial silicon layer located on the silicon wafer. In case the substrate 8 comprises a semiconductor substrate, semiconductor devices 620 may be formed on top of the substrate 8. Generally, the semiconductor devices 620 may comprise any type of semiconductor devices known in the art. In one embodiment, the semiconductor devices 620 may comprise complementary metal-oxide-semiconductor (CMOS) field effect transistors. In one embodiment, the semiconductor devices 620 may comprise a peripheral circuit for controlling operation of a three-dimensional memory device to be subsequently formed thereabove.

Optionally, metal interconnect structures 680 embedded within dielectric material layers 660 may be formed above the substrate 8. The metal interconnect structures 680 are also referred to as lower-level metal interconnect structures 680, and the dielectric material layers 660 are also referred to lower-level dielectric material layers 660. In case the semiconductor devices 620 are present, the lower-level metal interconnect structures 680 may provide electrical connection to the semiconductor devices 620. In one embodiment, the metal interconnect structures 680 may comprise metal pads 682, which may be employed as a contact pad for connection via structures to be subsequently formed.

In case the lower-level dielectric material layers 660 are present, a semiconductor material layer 10 maybe formed over the lower-level dielectric material layers 660. The semiconductor material layer 10 may comprise a single semiconductor material layer, or may comprise a vertical stack of multiple semiconductor material sublayers. In one embodiment, the semiconductor material layer 10 may have a doping of a first conductivity type, which may be p-type or n-type. In one embodiment, in-process source-level material layers may be formed in lieu of the semiconductor material layer 10. In this case, the in-process source-level material layers may comprise a vertical stack including a lower source semiconductor layer, a source-level sacrificial layer that is subsequently replaced with a source contact layer, and an upper source semiconductor layer. In case the lower-level dielectric material layers 660 are not employed, the semiconductor material layer 10 maybe omitted. While an embodiment is described in which a semiconductor material layer 10 is employed, embodiments are expressly contemplated herein in which the semiconductor material layer is replaced with in-process source-level material layers or is omitted.

An alternating stack of insulating layers 32 and sacrificial material layers 42 can be formed over the semiconductor material layer 10. The insulating layers 32 comprise a respective insulating material, such as a silicon oxide material. The sacrificial material layers 42 comprise a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

In one embodiment, the insulating layers 32 comprise first-type insulating layers 321 comprising a first insulating material and at least one second-type insulating layer 322 comprising a second insulating material that is different from the first insulating material. The bottommost layer among the insulating layers 32 is herein referred to as a bottommost insulating layer 32B. The topmost layer among the insulating layers 32 is herein referred to as a topmost insulating layer 32T.

In one embodiment, the first insulating material comprises a first silicon oxide-based material having a first etch rate in a wet etchant, such as in 100:1 dilute hydrofluoric acid, the second insulating material comprises a second silicon oxide-based material having a second etch rate in the same wet etchant, such as the 100:1 dilute hydrofluoric acid, and the second etch rate is greater than the first etch rate by a factor of at least 3. In an illustrative example, the first insulating material may comprise undoped silicate glass (i.e., silicon dioxide), a phosphosilicate glass, silicon oxycarbide or silicon oxycarbonitride, and the second insulating material may comprise borosilicate glass, an organosilicate glass, or porous silicate glass having a dielectric constant below 3.7 providing a higher etch rate in the wet etchant, such as 100:1 dilute hydrofluoric acid. The second insulating material may also have a lower density than the first insulating material. For example, the first insulating material may comprise silicon dioxide having a first porosity and a dielectric constant of 3.7 to 3.9, and the second insulating material may comprise silicon dioxide having a second porosity greater than the first porosity and a dielectric constant of less than 3.7, such as 1.2 to 3.5. In other words, the second insulating material may comprise a lower density silicon dioxide than the first material.

Generally, the second insulating material has a higher etch rate than the first insulating material. Thus, each second-type insulating layer 322 is referred to as a high-etch-rate insulating layer. The rest of the insulating layers 32 may comprise first-type insulating layers 321. In one embodiment, the bottommost insulating layer 32B and the topmost insulating layer 32T may be a first-type insulating layer 132.

In one embodiment, the at least one second-type insulating layer 322 can be formed at a level or at a plurality of levels at which reduction in the neighboring word line interference (NWI) is desired. Such levels may include the level that directly underlies the topmost sacrificial material layer 42, or a plurality of levels that includes the level that directly underlies the topmost sacrificial material layer 42. Without wishing to be bound by a particular theory, the present inventors believe that the upper layers in the alternating stack may have a lower thickness than the middle and lower layers in the alternating stack due to substrate 8 warpage which may cause a RF power loss during the deposition of the upper layer in the alternating stack. The lower thickness of the upper layers may lead to a higher NWI in the upper layers than in the middle or lower layers of the completed NAND memory device.

Alternatively or additionally, the at least one second-type insulating layer 322 may be formed at the level that directly overlies the bottommost sacrificial material layer 42, or at a plurality of levels of insulating layers 32 that includes the level that directly overlies the bottommost sacrificial material layer 42.

While an embodiment is described in which two second-type insulating layers 322 are located at the upper levels of the alternating stack (e.g., at levels of insulating layers 32 that underlie the topmost insulating layer 32T), other embodiments are expressly contemplated herein in which different numbers of second-type insulating layers 322 (such as 1, 3, 4, 5, 6 etc.) are employed, and/or the at least one second-type insulating layer 322 is employed at any different level. The at least one second-type insulating layer 322 may be located at the drain-select-level (i.e., a level of the drain side select gate electrode(s)) and/or at upper word line level, as will be described in more detail below.

The sacrificial material layers 42 may comprise an insulating material, a semiconductor material, or a conductive material. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and/or germanium.

The insulating layers 32 can be deposited, for example, by plasma enhanced chemical vapor deposition (PECVD). The sacrificial material layers 42 can be formed, for example, by PECVD. The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed.

The first exemplary structure may comprise a memory array region 100 in which memory stack structures are to be subsequently formed, and a contact region 200 in which stepped surfaces and contact via structures are to be subsequently formed.

Figure 2:
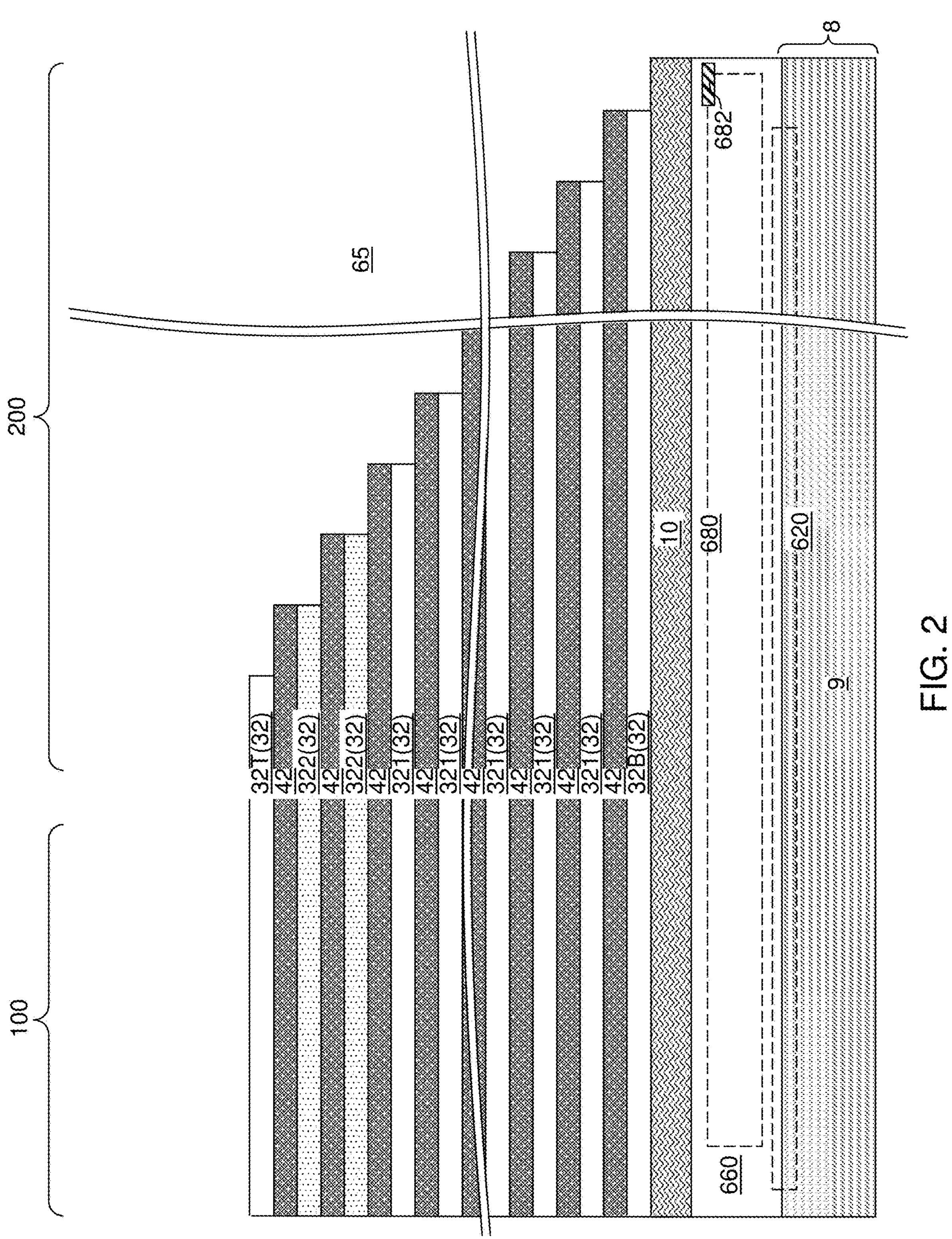
FIG. 2 is a schematic vertical cross-sectional view of the first exemplary structure after formation of stepped terraces according to the first embodiment of the present disclosure.

Referring to FIG. 2, stepped surfaces are formed at a peripheral portion of the alternating stack (32, 42), which is herein referred to as a terrace region. As used herein, “stepped surfaces” refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A “stepped cavity” refers to a cavity having stepped surfaces.

The terrace region is formed in the contact region 200. The stepped cavity can have various stepped surfaces such that the horizontal cross-sectional shape of the stepped cavity changes in steps as a function of the vertical distance from the top surface of the semiconductor material layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a “level” of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple “columns” of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 200.

Figure 3:
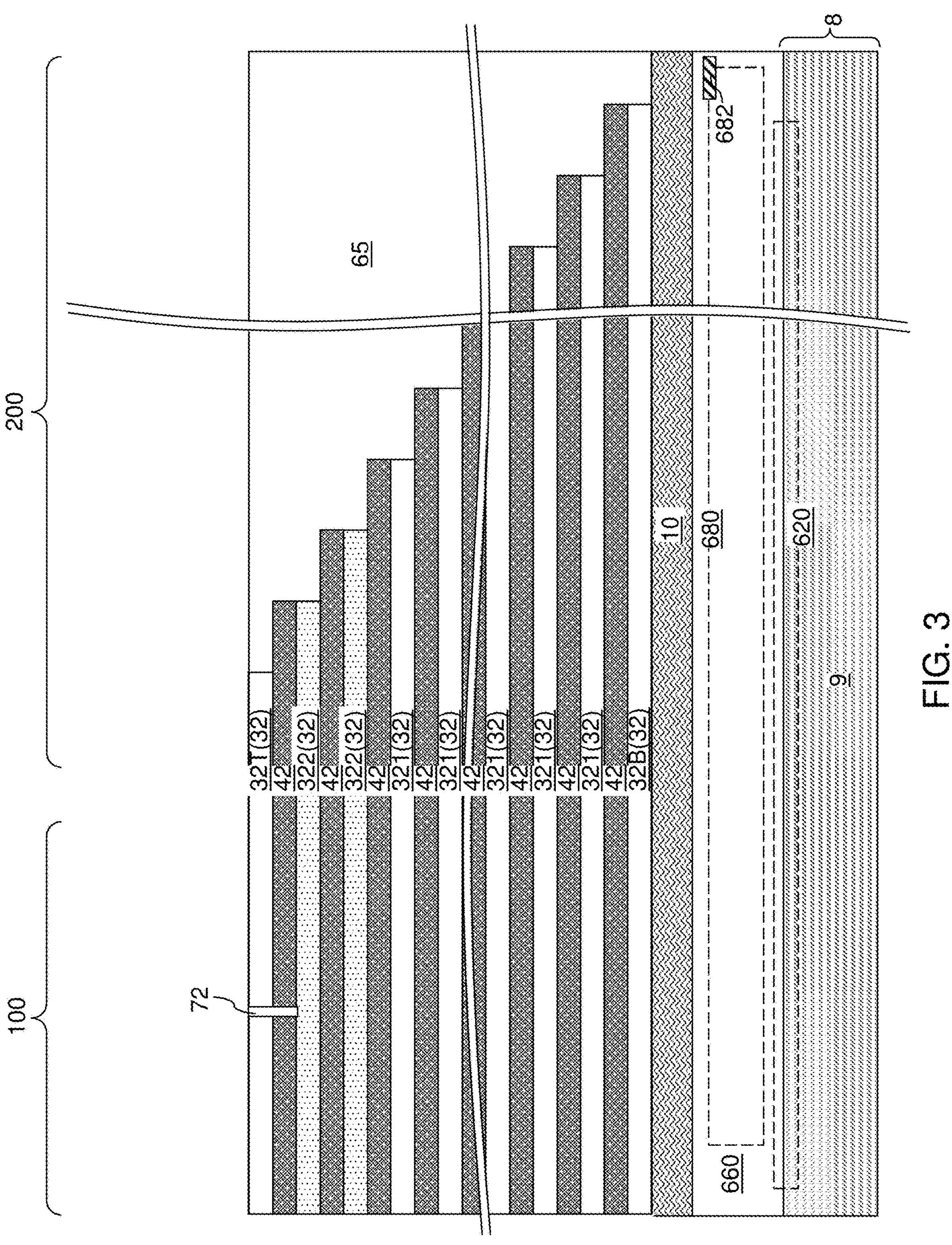
FIG. 3 is a schematic vertical cross-sectional view of the first exemplary structure after formation of a retro-stepped dielectric material portion according to the first embodiment of the present disclosure.

Referring to FIG. 3, a retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 mayor may not, be doped with dopants such as B, P, and/or F.

Optionally, drain-select-level isolation structures 72 can be formed through the topmost insulating layer 32T and a subset of the sacrificial material layers 42 located at drain-select-levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the topmost insulating layer 32T.

Figure 4A:
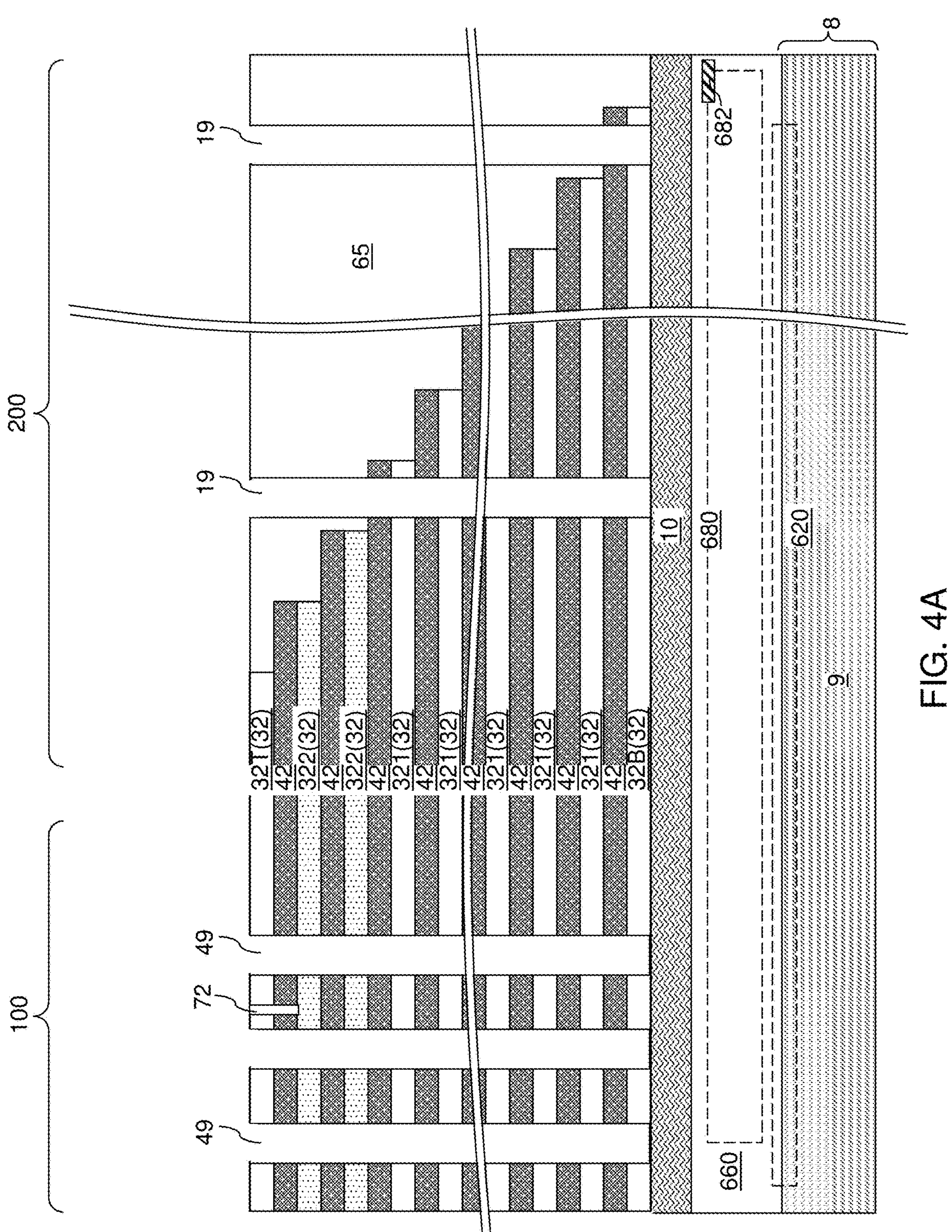
FIG. 4A is a schematic vertical cross-sectional view of the first exemplary structure after formation of memory openings and support openings according to the first embodiment of the present disclosure.
Figure 4B:
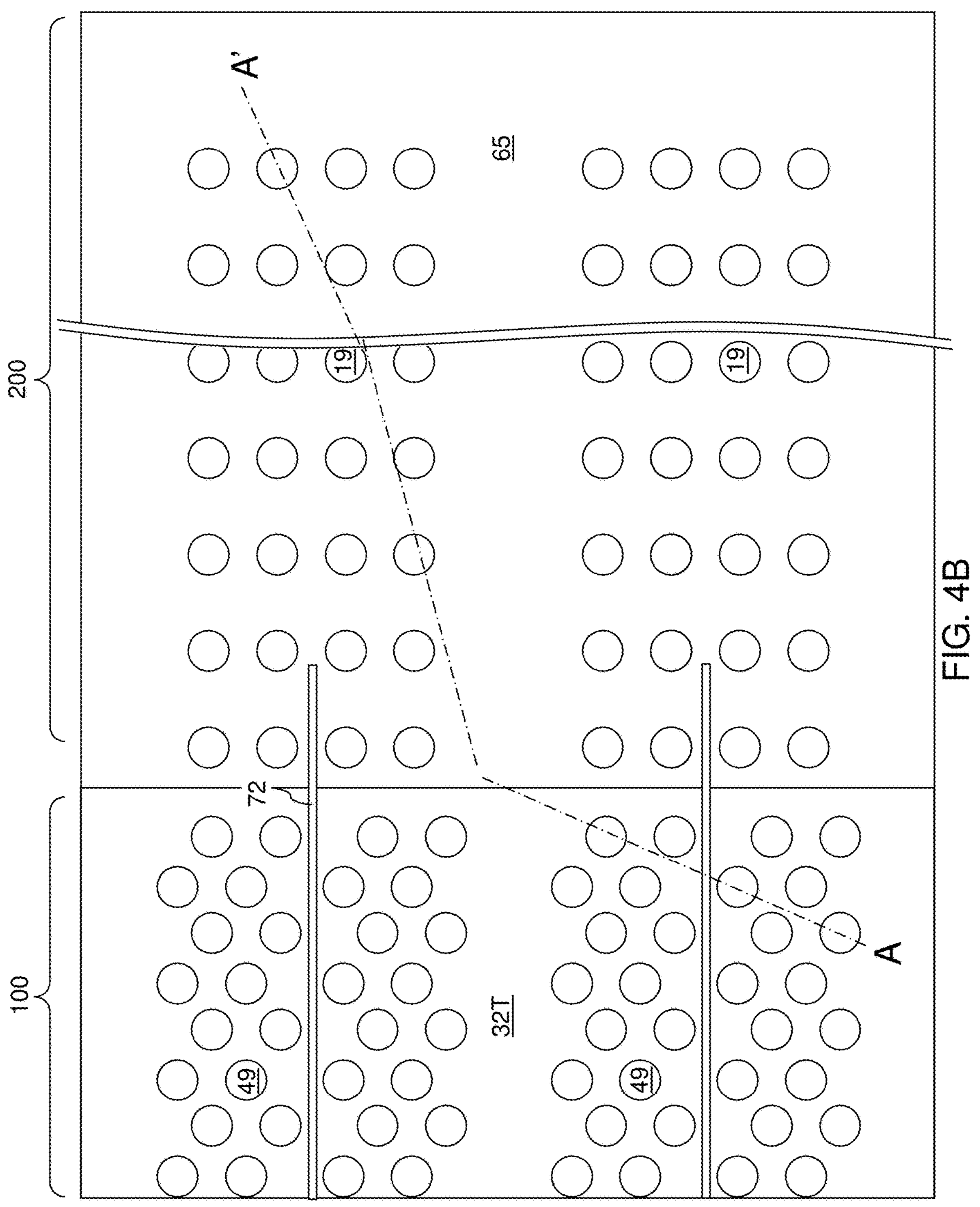
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the topmost insulating layer 32T and the retro-stepped dielectric material portion 65, and can be lithographically patterned to form openings therein. The openings include a first set of openings formed over the memory array region 100 and a second set of openings formed over the contact region 200. The pattern in the lithographic material stack can be transferred through the topmost insulating layer 32T or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which a memory stack structure, is subsequently formed. As used herein, a "support opening" refers to a structure in which a support structure (such as a support pillar structure) that mechanically supports other elements is subsequently formed. The memory openings 49 are formed through the topmost insulating layer 32T and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 200.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 maybe optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 maybe vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the semiconductor material layer 10. A two-dimensional array of memory openings 49 can be formed in the memory array region 100. A two-dimensional array of support openings 19 can be formed in the contact region 200.

Figure 5:
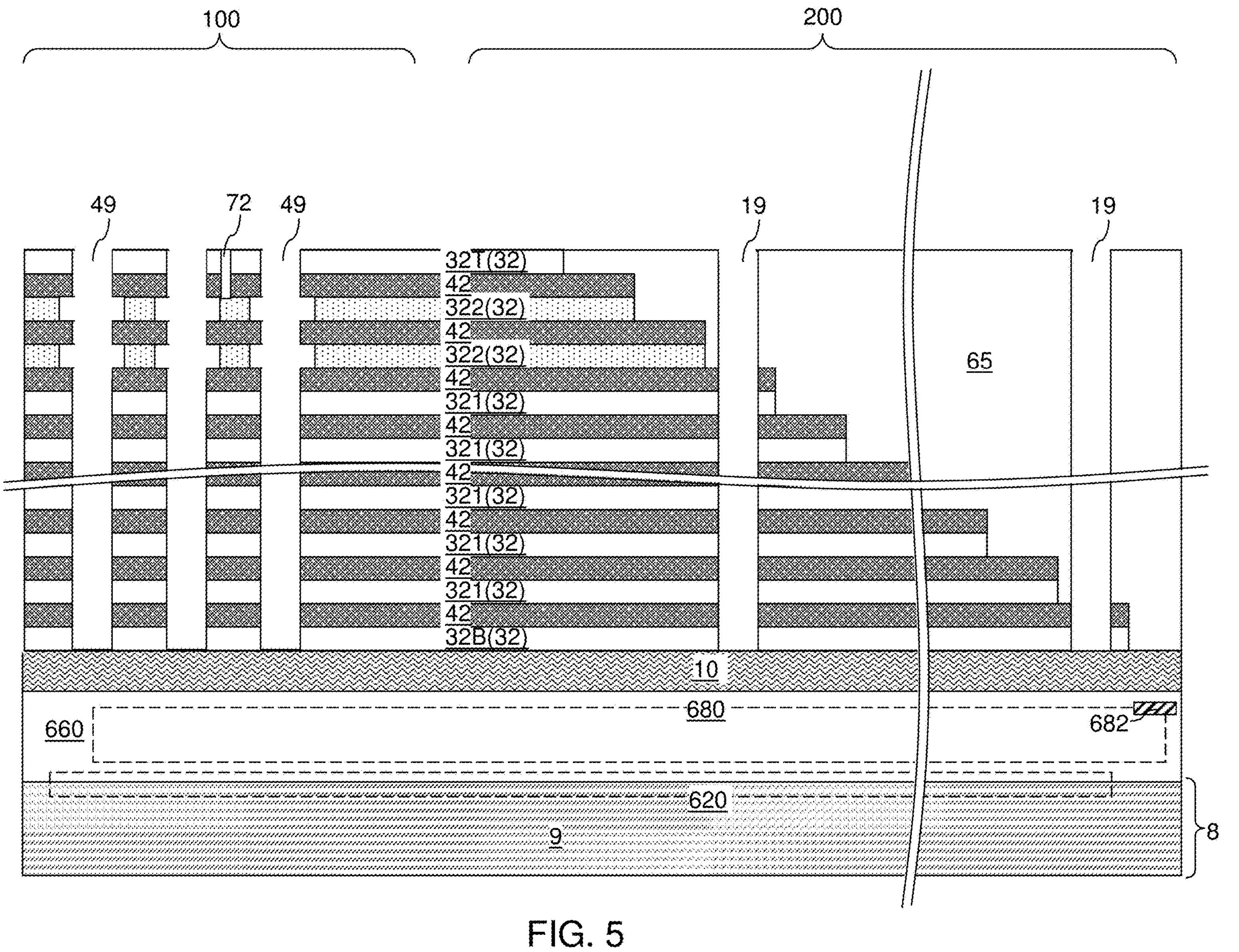
FIG. 5 is a schematic vertical cross-sectional view of the first exemplary structure after laterally recessing second-type insulating layers around the memory openings according to the first embodiment of the present disclosure.
Figures 6A, 6B:
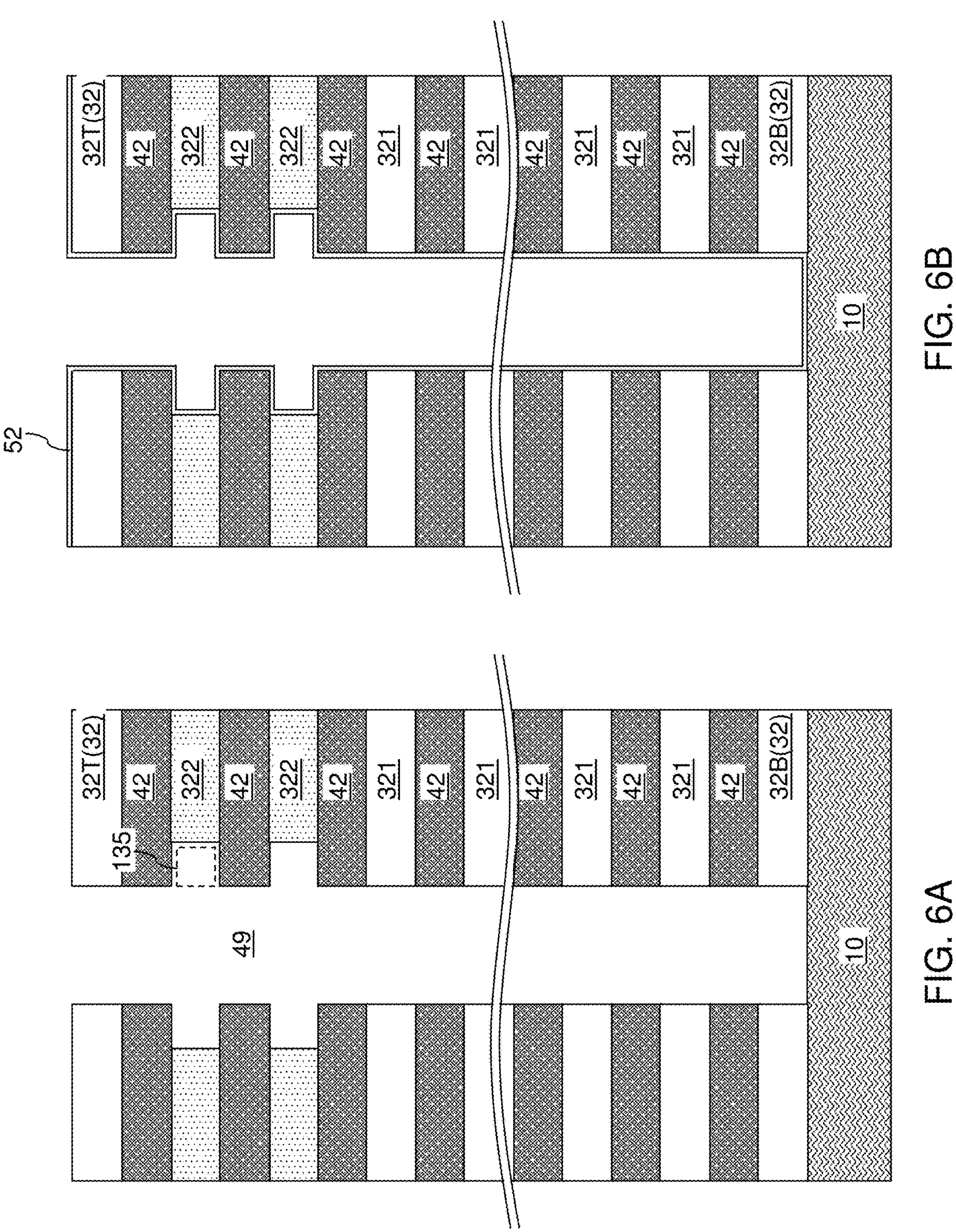
FIGS. 6A-6L are sequential schematic vertical cross-sectional views of a memory opening within the first exemplary structure during formation of a memory opening fill structure according to the first embodiment of the present disclosure.

Referring to FIGS. 5 and 6A, an isotropic etch process can be performed to laterally recess the second-type insulating layers 322 selective to materials of the first-type insulating layers 321 and the sacrificial material layers 42. At least one lateral recess 135 can be formed at each level of the at least one second-type insulating layer 322 upon laterally expanding the memory opening 49 at each level of the at least one second-type insulating layer 322.

In an illustrative example, the first-type insulating layers 321 may comprise undoped silicate glass, silicon oxycarbide or silicon oxycarbonitride, and the second-type insulating layers 322 may comprise borosilicate glass, organosilicate glass, or porous silicate glass, and the sacrificial material layers 42 may comprise silicon nitride. In this case, the isotropic etch process may comprise a wet etch process employing 100:1 dilute hydrofluoric acid, or a hydrofluoric acid solution having a different dilution ratio. The lateral recess distance of the lateral recesses 135 may be in a range from 1 nm to 20 nm, such as from 2 nm to 10 nm, although lesser and greater lateral recess distances may also be employed. Each of the lateral recesses 135 may have an annular configuration, and is adjoined to a respective memory opening 49.

Referring to FIG. 6B, an optional blocking dielectric layer 52 maybe conformally deposited. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Figures 6C, 6D:
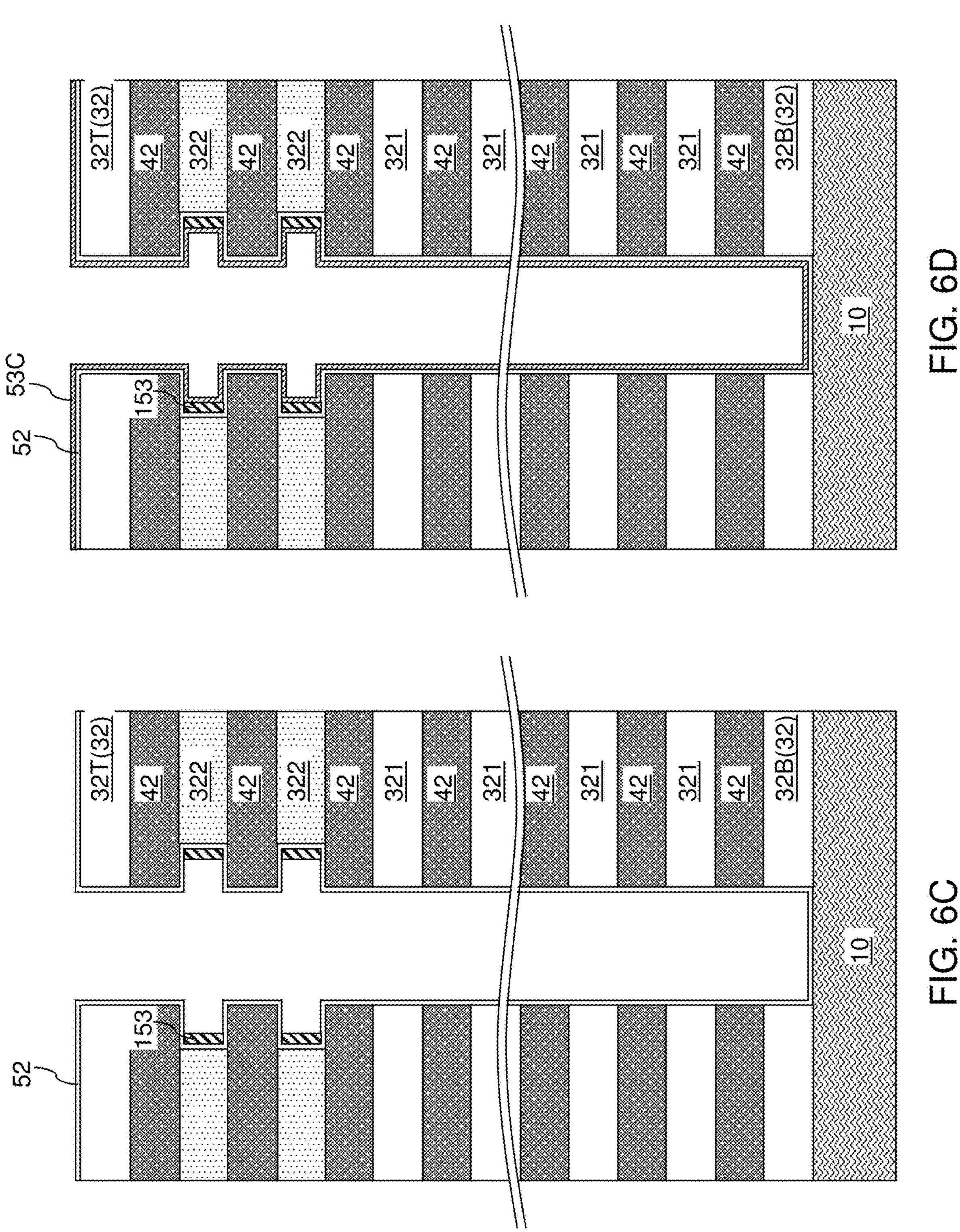

Referring to FIG. 6C, metal portions 153 may be formed at outer portions of the lateral recesses 135. The metal portions 153 may be formed by conformal deposition of a silicide-forming metal, and subsequent removal of the silicide-forming metal from outside the volumes of the lateral recesses 135. The silicide-forming metal may be any metal that reacts with silicon to form a metal silicide, and may include any of cobalt, tungsten, titanium, molybdenum, nickel, and/or platinum. The silicide-forming metal may be deposited by a chemical vapor deposition process, an atomic layer deposition process, or any other conformal deposition process. In one embodiment, the silicide-forming metal may be removed from outside the volumes of the lateral recesses 135 by performing an anneal in case the silicide-forming metal is self-agglomerating (as in the case of cobalt). In this embodiment, the metal agglomerates into the lateral recesses 135 during the anneal. In another embodiment, the silicide-forming metal may be removed from outside the volumes of the lateral recesses 135 by performing an anisotropic etch process that etches the silicide-forming metal from inside the memory openings 49 without completely removing the silicide-forming metal from inside the lateral recesses 135. In one embodiment, each of the metal portions 153 may have a respective annular shape. The lateral dimension of each metal portion 153, as measured between an outer sidewall and an inner sidewall, may be in a range from 1 nm to 10 nm, such as from 2 nm to 5 nm, although lesser and greater thicknesses may also be employed.

Referring to FIG. 6D, a continuous silicon layer 53C can be conformally deposited in the memory openings 49 and in remaining volumes of the lateral recesses 135. The continuous silicon layer 53C may be formed, for example, by a low pressure chemical vapor deposition process. The continuous silicon layer 53C may directly contact each metal portion 153. The continuous silicon layer 53C may comprise amorphous silicon or polysilicon. The thickness of the continuous silicon layer 53C may be in a range from 2 nm to 20 nm, such as from 5 nm to 10 nm, although lesser and greater thicknesses may also be employed.

Figures 6E, 6F:
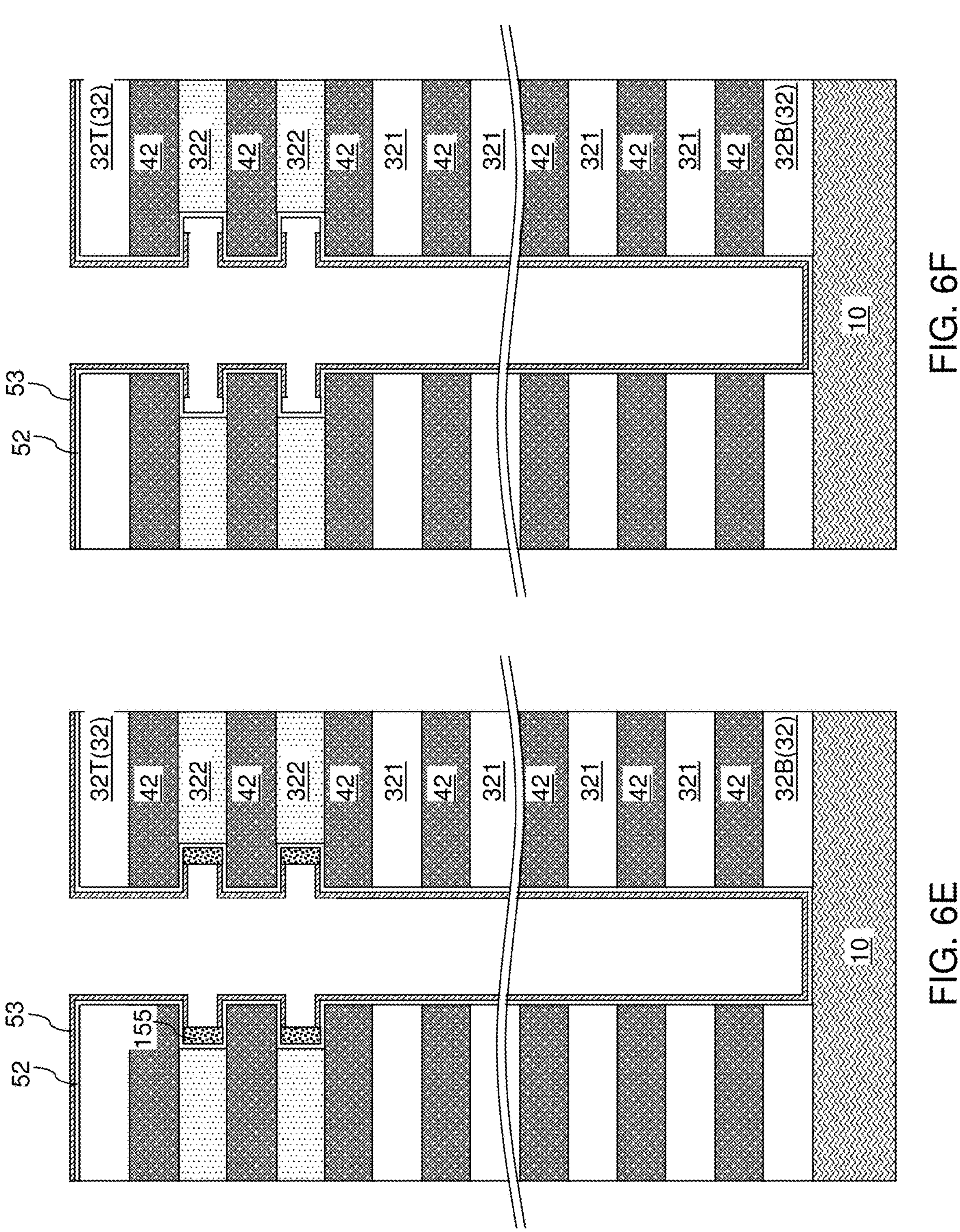

Referring to FIG. 6E, an anneal process can be performed at an elevated temperature to induce formation of a metal silicide between the metal portions 153 and portions of the continuous silicon layer 53C that contact the metal portions 153. The elevated temperature of the thermal anneal process can be selected based on the silicide formation temperature of the silicide-forming metal, and may be, for example, in a range from 500 degrees Celsius to 800 degrees Celsius. A metal silicide portion 155 can be formed within each of the lateral recesses 135. The duration of the thermal anneal process may be selected such that the entirety of each metal portion 153 reacts with the continuous silicon layer 53C and is converted into a respective metal silicide portion 155. The remaining unreacted portions of the continuous silicon layer 53C located in each memory opening 49 comprise a plurality of silicon layers 53 that are disjoined from each other by at least one metal silicide portion 155.

Referring to FIG. 6F, a wet etch process can be performed to remove the metal silicide material of the metal silicide portions 155 selective to the silicon layers 53 (which are unreacted remaining portions of the continuous silicon layer 53C). The chemistry of the wet etch process may be selected depending on the composition of the metal silicide portions 155. Each memory opening 49 may comprise a plurality of silicon layers 53 that are vertically spaced apart from each other at each level of the second-type insulating layers 322. Thus, portions of the continuous silicon layer 53C can be removed at each level of the at least one lateral recess 135 in the second-type insulating layer(s) 332. Remaining portions of the continuous silicon layer 53C comprise the silicon layers 53. The silicon layers 53 can be vertically spaced apart from each other at the level of the at least one lateral recess 135 in the second-type insulating layer(s) 332.

Figures 6G, 6H:
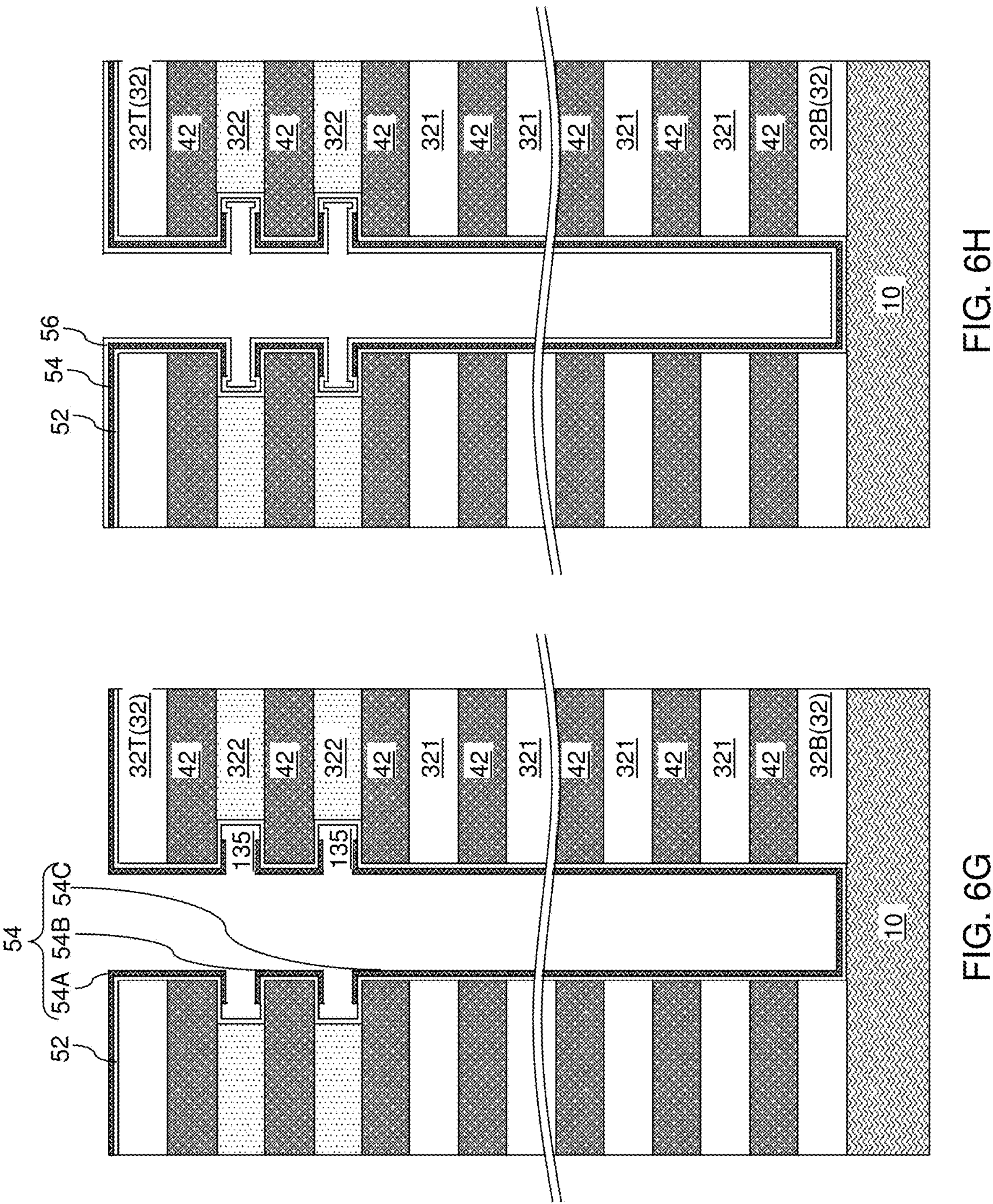

Referring to FIG. 6G, a nitridation process can be performed to nitride the silicon layers 53. The silicon layers 53 can be converted into charge storage material layers 54 (e.g., 54A, 54B, 54C) comprising and/or consisting essentially of silicon nitride. The charge storage material layers 54 (e.g., 54A, 54B, 54C) in the same memory opening 49 are vertically spaced apart from each other at the level(s) of the at least one lateral recess 135. In one embodiment, the charge storage material layers 54 are formed directly on an inner sidewall of the blocking dielectric layer 52 (if present). At least one cylindrical surface segment of the blocking dielectric layer 52 can be exposed after formation of the charge storage material layers 54. Specifically, a cylindrical surface segment of the blocking dielectric layer 52 can be physically exposed in the at least one lateral recess 135 at each level of the second-type insulating layer(s) 332 around each memory opening 49. The charge storage material layers 54 can be employed as charge trapping material portions. Each portion of the charge storage material layers 54 located at a level of a respective sacrificial material layer 42 around a memory opening 49 can function as a charge-trapping memory element.

Referring to FIG. 6H, a tunneling dielectric layer 56 can be formed by a conformal deposition process. The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

Figure 6J:
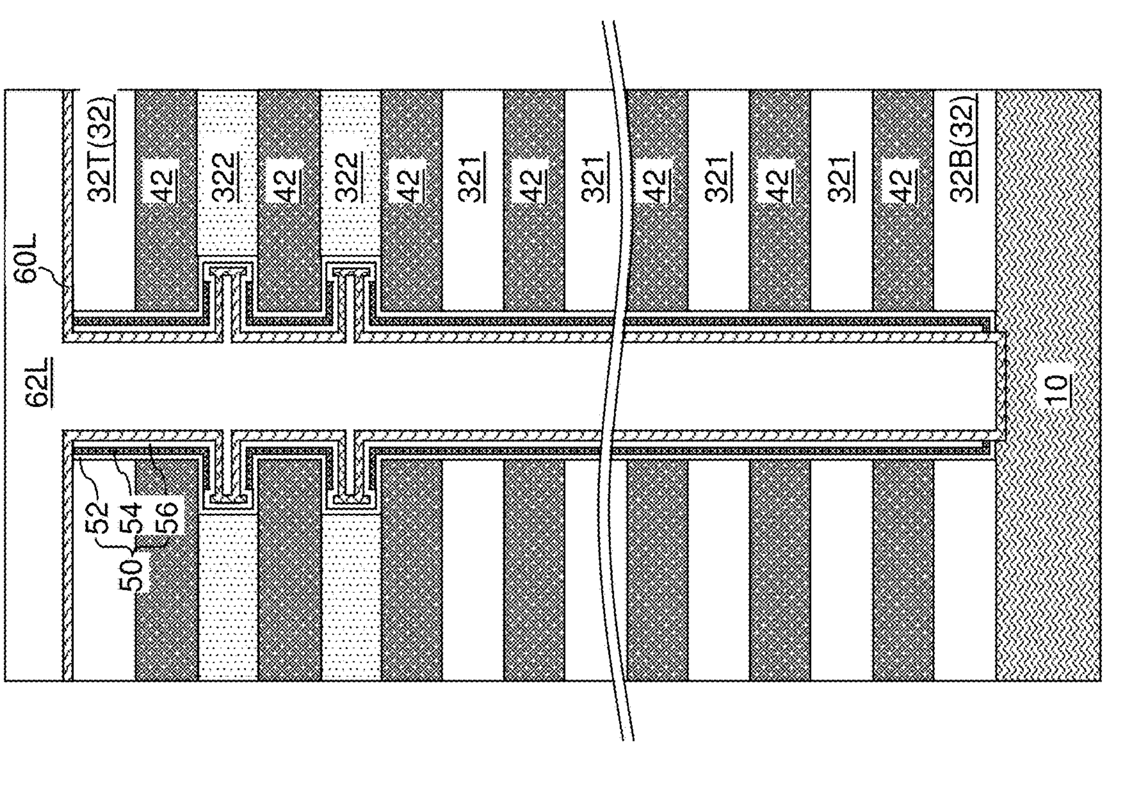
Figure 6J:
Figure 6I:
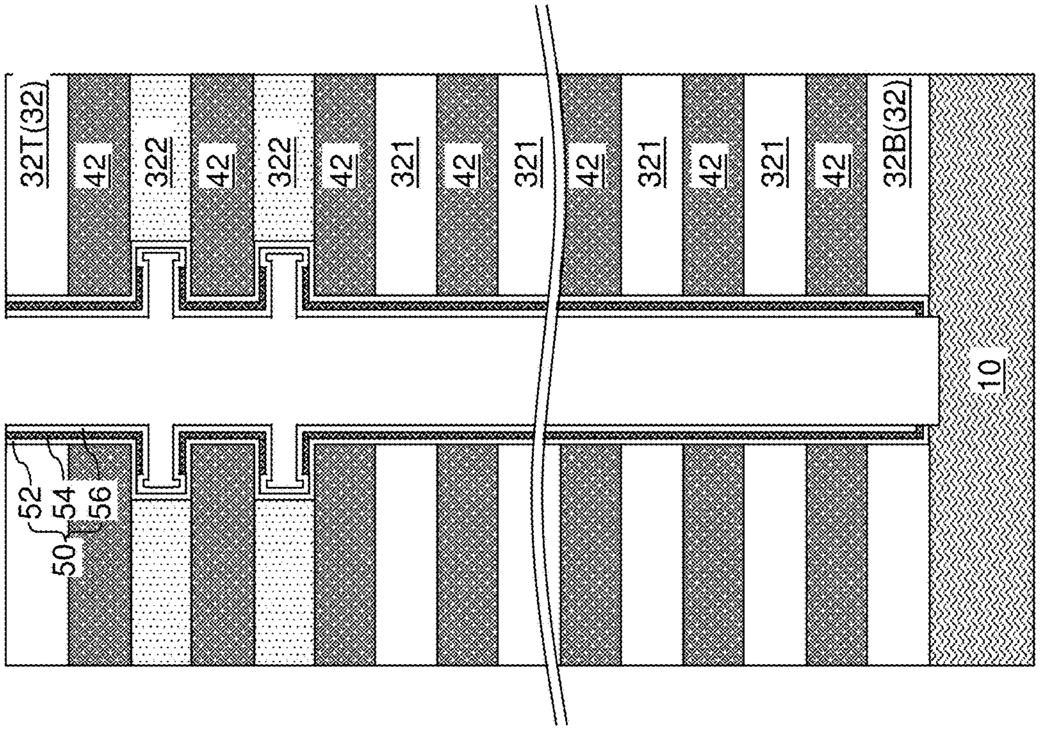

Referring to FIG. 6I, a sacrificial cover layer (not shown) may be optionally deposited over the tunneling dielectric layer 56. Horizontally-extending portions of the sacrificial cover layer, the tunneling dielectric layer 56, the charge storage material layers 54, and the blocking dielectric layer 52 can be removed by performing an anisotropic etch process. The sacrificial cover layer, the tunneling dielectric layer 56, the charge storage material layers 54, and the blocking dielectric layer 52 can be removed from above the horizontal plane including the top surface of the topmost insulating layer 32T. Further, the sacrificial cover layer, the tunneling dielectric layer 56, the charge storage material layers 54, and the blocking dielectric layer 52 can be removed from the bottom of each of the memory openings 49 to expose a respective portion of the top surface of the semiconductor material layer 10 underneath each of the memory openings 49. The sacrificial cover layer, if employed, can be subsequently removed selective to the tunneling dielectric layer 56. Each continuous combination of remaining portions of the blocking dielectric layer 52, the charge storage material layers 54, and the tunneling dielectric layer 56 located within a respective one of the memory openings 49 constitutes a memory film 50. Each memory film 50 may comprise a plurality of charge storage material layers 54 (e.g., 54A-54C) that are vertically spaced apart from each other at each level of the second-type insulating layer(s) 322.

Referring to FIG. 6J, a semiconductor channel layer 60L can be deposited directly on the semiconductor surface of the semiconductor material layer 10 and directly on the tunneling dielectric layers 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity in each memory opening, or may fully fill the cavity in each memory opening.

In case each memory opening is not completely filled by the semiconductor channel layer 60L, a dielectric core layer 62L can be deposited in remaining unfilled volumes of the memory openings 49. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figures 6K, 6L:
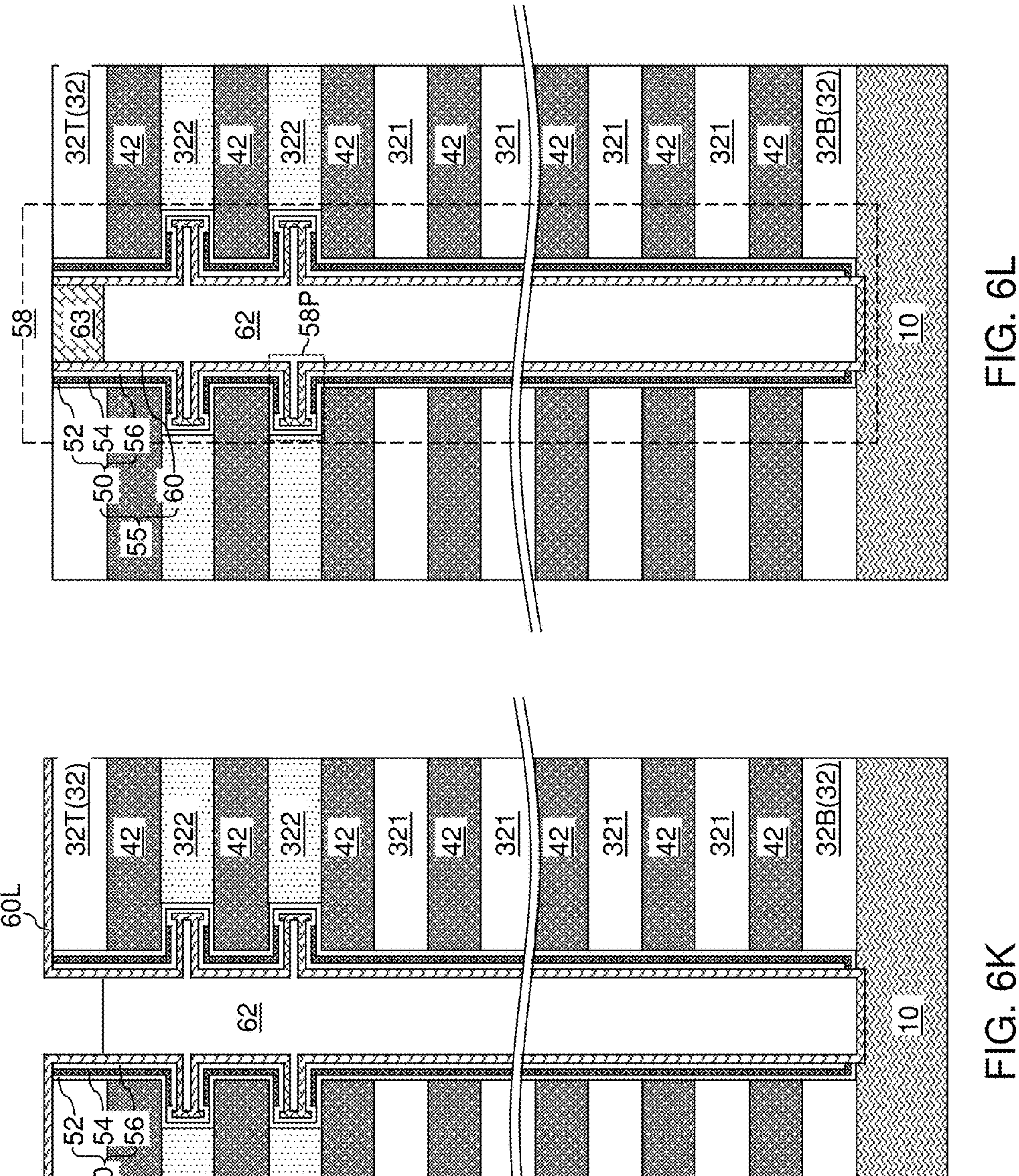

Referring to FIG. 6K, the horizontally-extending portion of the dielectric core layer 62L can be removed, for example, by a recess etch process such that each remaining portions of the dielectric core layer 62L is located within a respective memory opening 49 and has a respective top surface below the horizontal plane including the top surface of the topmost insulating layer 32T. Each remaining portion of the dielectric core layer 62L constitutes a dielectric core 62.

Referring to FIG. 6L, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the topmost insulating layer 32T, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

Within each memory opening 49, a tunneling dielectric layer 56 is surrounded by a plurality of charge storage material layers 54 (e.g., 54A-54C), and laterally surrounds a vertical semiconductor channel 60. Each adjoining set of a blocking dielectric layer 52, charge storage material layers 54, and a tunneling dielectric layer 56 collectively constitute a memory film 50, which can store electrical charges or ferroelectric polarization with a macroscopic retention time. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, the charge storage material layers 54, and an optional blocking dielectric layer 52. Each combination of a memory stack structure 55, a dielectric core 62, and a drain region 63 within a memory opening 49 is herein referred to as a memory opening fill structure 58. The memory opening fill structure 58 contains a lateral outward protrusion 58P extending into the respective recess 135 at each level of the second-type insulating layer(s) 322, and no lateral outward protrusion 58P at each level of the first-type insulating layer(s) 321. Each combination of a memory film 50, a vertical semiconductor channel 60, a dielectric core 62, and a drain region 63 within each support opening 19 fills the respective support openings 19, and constitutes a support pillar structure.

According to an aspect of the present disclosure, vertical separation of the charge storage layers 54A, 54B, 54C at the levels of the second-type insulating layer(s) 322 decreases NWI at the upper level of the memory device.

Figure 7:
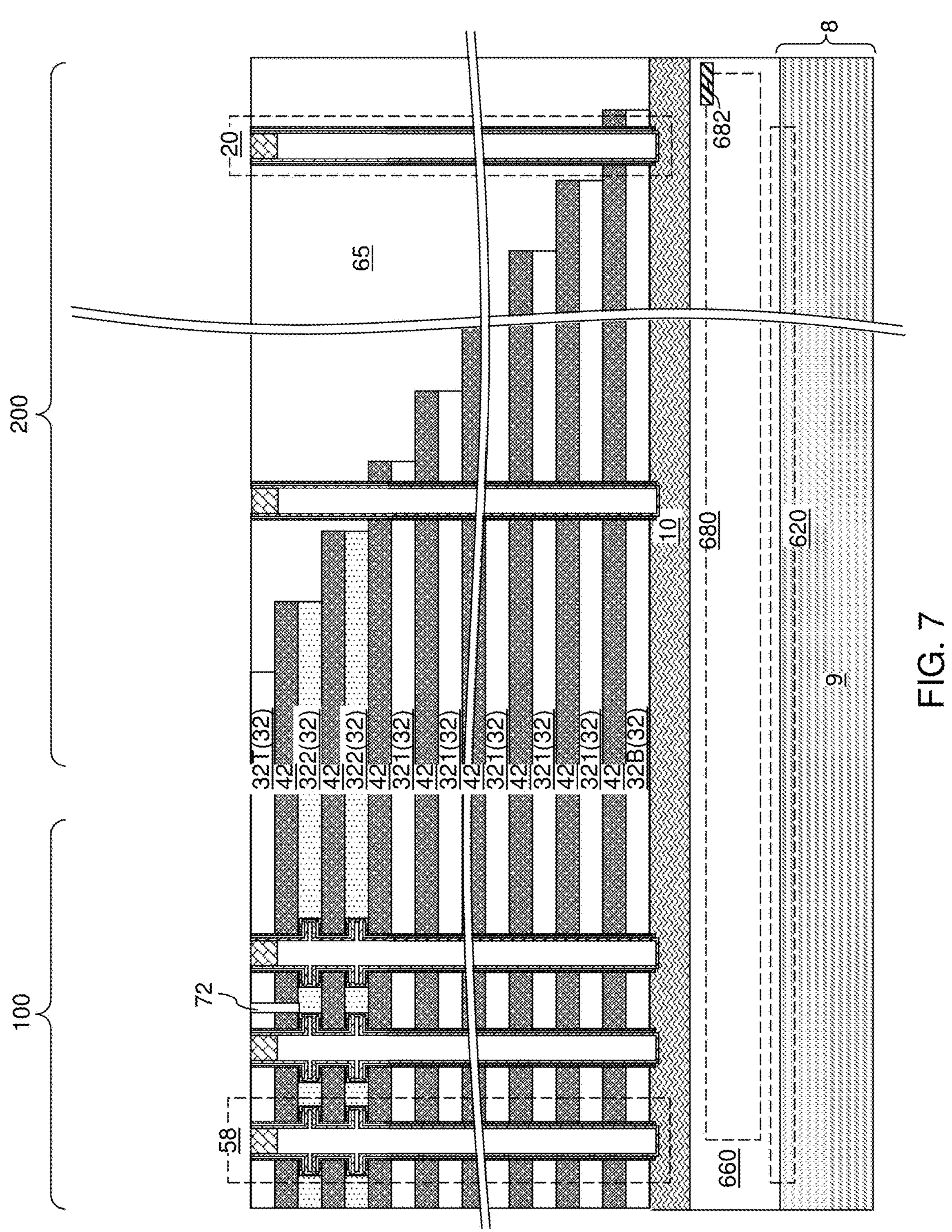
FIG. 7 is a schematic vertical cross-sectional view of the first exemplary structure after formation of memory opening fill structures and support pillar structures according to the first embodiment of the present disclosure.

Referring to FIG. 7, the first exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIG. 5. An instance of the support pillar structure 20 can be formed within each support opening 19 of the structure of FIG. 5.

Each memory stack structure 55 includes a vertical semiconductor channel 60 and a memory film 50. The memory film 50 may comprise a tunneling dielectric layer 56 laterally surrounding the vertical semiconductor channel 60 and a vertical stack of charge storage regions laterally surrounding the tunneling dielectric layer 56 and an optional blocking dielectric layer 52.

Figure 8A:
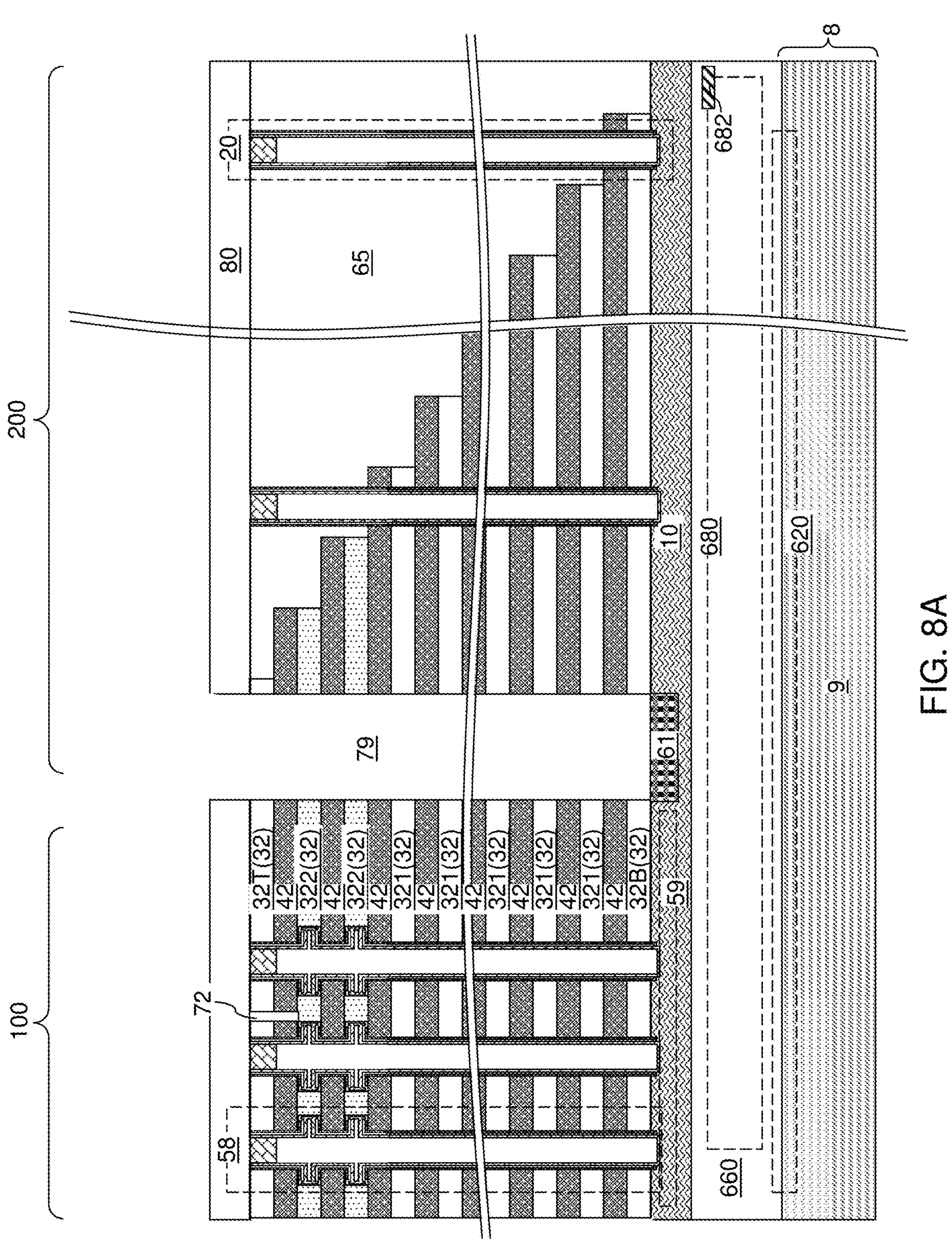
FIG. 8A is a schematic vertical cross-sectional view of the first exemplary structure after formation of backside trenches according to the first embodiment of the present disclosure.
Figure 8B:
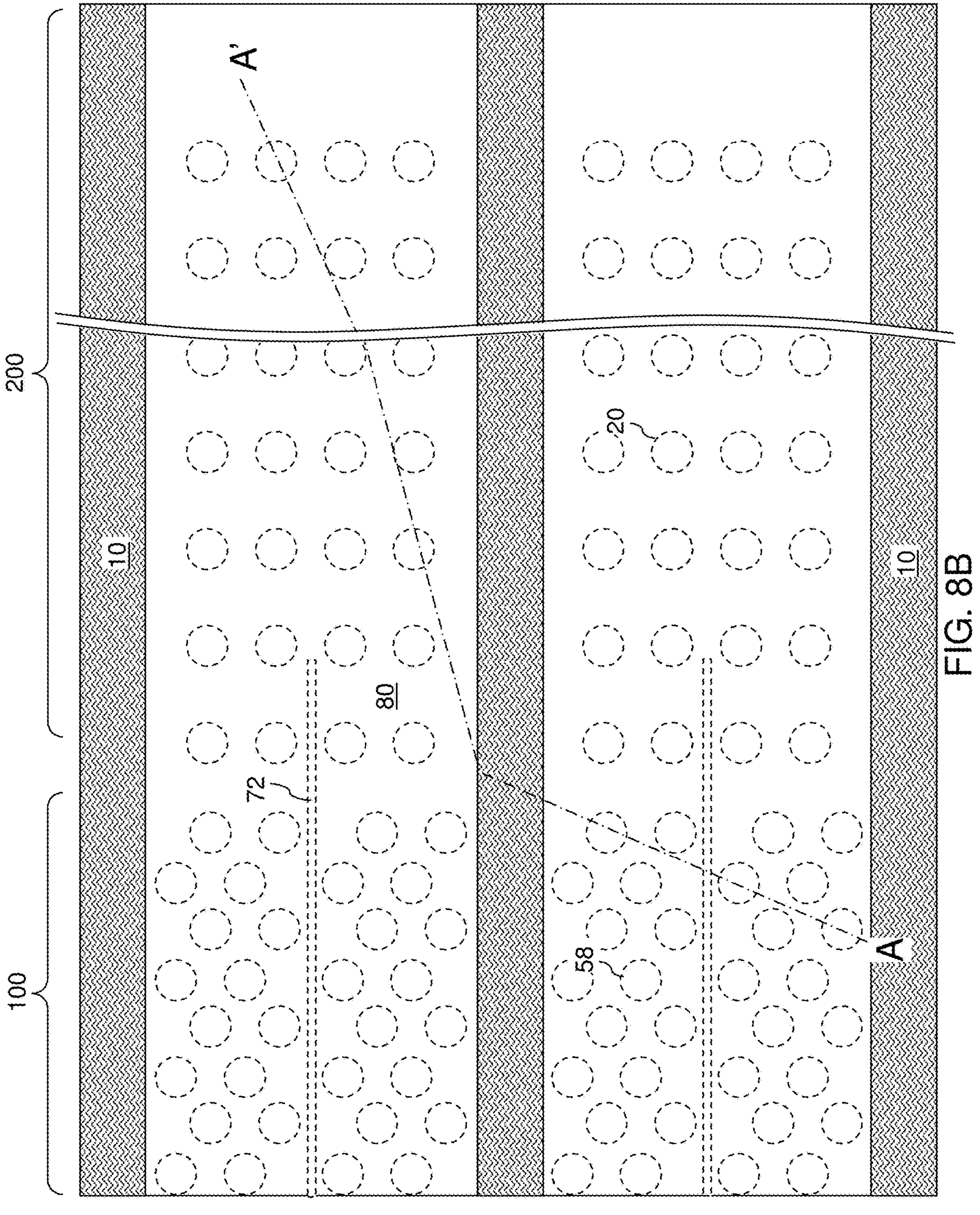
FIG. 8B is a partial see-through top-down view of the first exemplary structure of FIG. 7A. The vertical plane A-A' is the plane of the schematic vertical cross-sectional view of FIG. 7A.

Referring to FIGS. 8A and 8B, a contact-level dielectric layer 80 can be formed over the alternating stack (32, 42) of insulating layer 32 and sacrificial material layers 42, and over the memory stack structures 55 and the support pillar structures 20. The contact-level dielectric layer 80 includes a dielectric material that is different from the dielectric material of the sacrificial material layers 42. For example, the contact-level dielectric layer 80 can include silicon oxide. The contact-level dielectric layer 80 can have a thickness in a range from 50 nm to 500 nm, although lesser and greater thicknesses can also be employed.

A photoresist layer (not shown) can be applied over the contact-level dielectric layer 80, and is lithographically patterned to form openings in areas between clusters of memory stack structures 55. The pattern in the photoresist layer can be transferred through the contact-level dielectric layer 80, the alternating stack (32, 42) and/or the retro-stepped dielectric material portion 65 employing an anisotropic etch to form backside trenches 79, which vertically extend from the top surface of the contact-level dielectric layer 80 at least to the top surface of the semiconductor material layer 10, and laterally extend through the memory array region 100 and the contact region 200.

In one embodiment, the backside trenches 79 can laterally extend along the first horizontal direction hd1 (which may be a word line direction), and can be laterally spaced apart among one another along the second horizontal direction hd2 (which may be a bit line direction) that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing. Generally, backside trenches 79 laterally extending along the first horizontal direction hd1 can be formed through the contact-level dielectric layer 80 and the alternating stack (32, 42). The alternating stack (32, 42) as formed at the processing steps of FIG. 2 is divided into multiple alternating stacks (32, 42) that are laterally spaced apart along the second horizontal direction hd2 by the backside trenches 79.

Dopants of the second conductivity type can be implanted into physically exposed surface portions of the semiconductor material layer 10 (which may be surface portions of the semiconductor material layer 10) that are located at the bottom of the backside trenches by an ion implantation process. A source region 61 can be formed at a surface portion of the semiconductor material layer 10 under each backside trench 79. Each source region 61 is formed in a surface portion of the semiconductor material layer 10 that underlies a respective backside trench 79. Due to the straggle of the implanted dopant atoms during the implantation process and lateral diffusion of the implanted dopant atoms during a subsequent activation anneal process, each source region 61 can have a lateral extent greater than the lateral extent of the lateral extent of the overlying backside trench 79.

An upper portion of the semiconductor material layer 10 that extends between the source region 61 and the vertical semiconductor channels 60 in the memory opening fill structures 58 constitutes a horizontal semiconductor channel 59 for a plurality of field effect transistors. The horizontal semiconductor channel 59 is connected to multiple vertical semiconductor channels 60.

Figure 9:
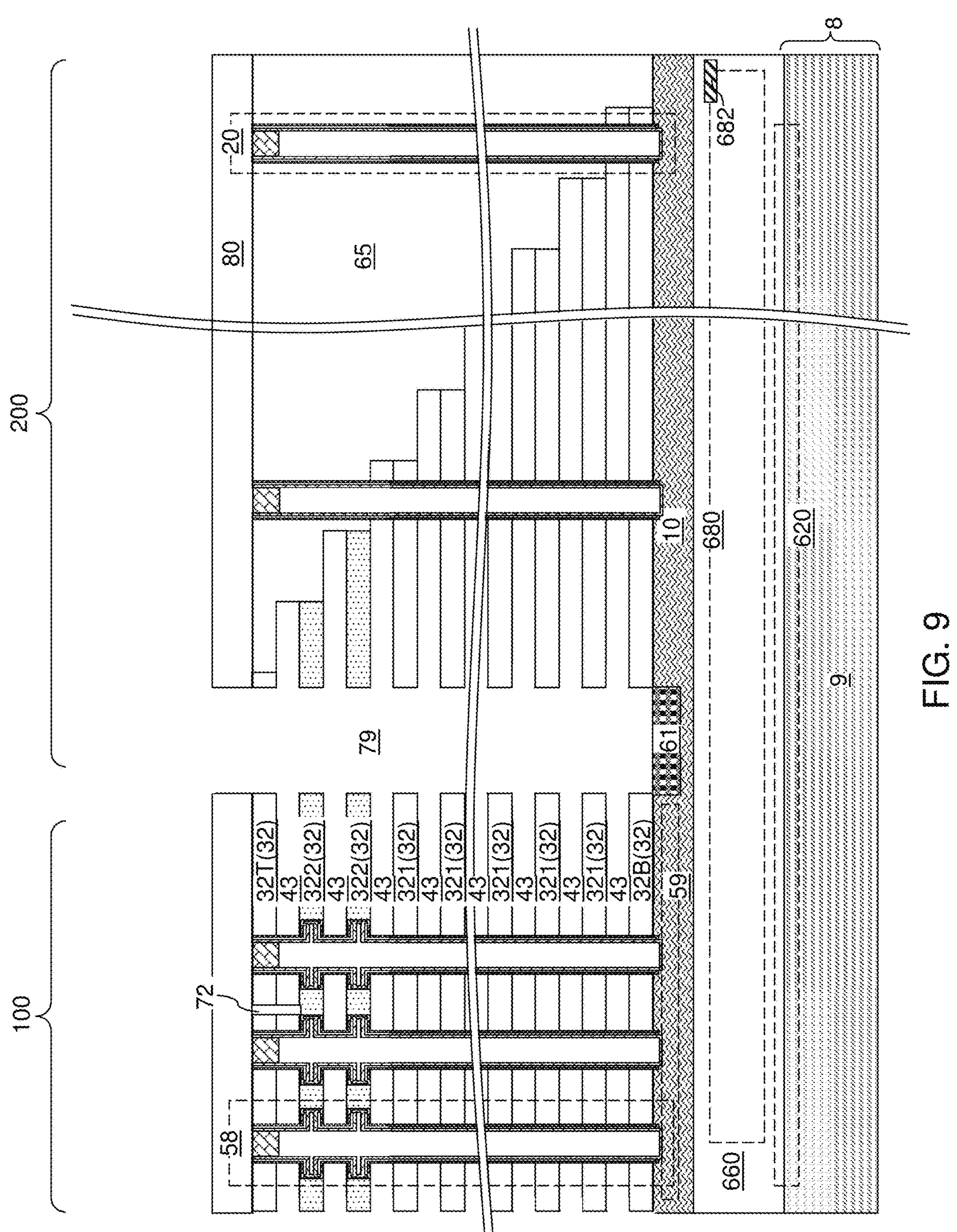
FIG. 9 is a schematic vertical cross-sectional view of the first exemplary structure after formation of backside recesses according to the first embodiment of the present disclosure.

Referring to FIG. 9, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. Each of the plurality of backside recesses 43 can extend substantially parallel to the top surface of the semiconductor material layer 10. A backside recess 43 can be vertically bounded by a top surface of an underlying insulating layer 32 and a bottom surface of an overlying insulating layer 32. In one embodiment, each backside recess 43 can have a uniform height throughout.

Figure 10A:
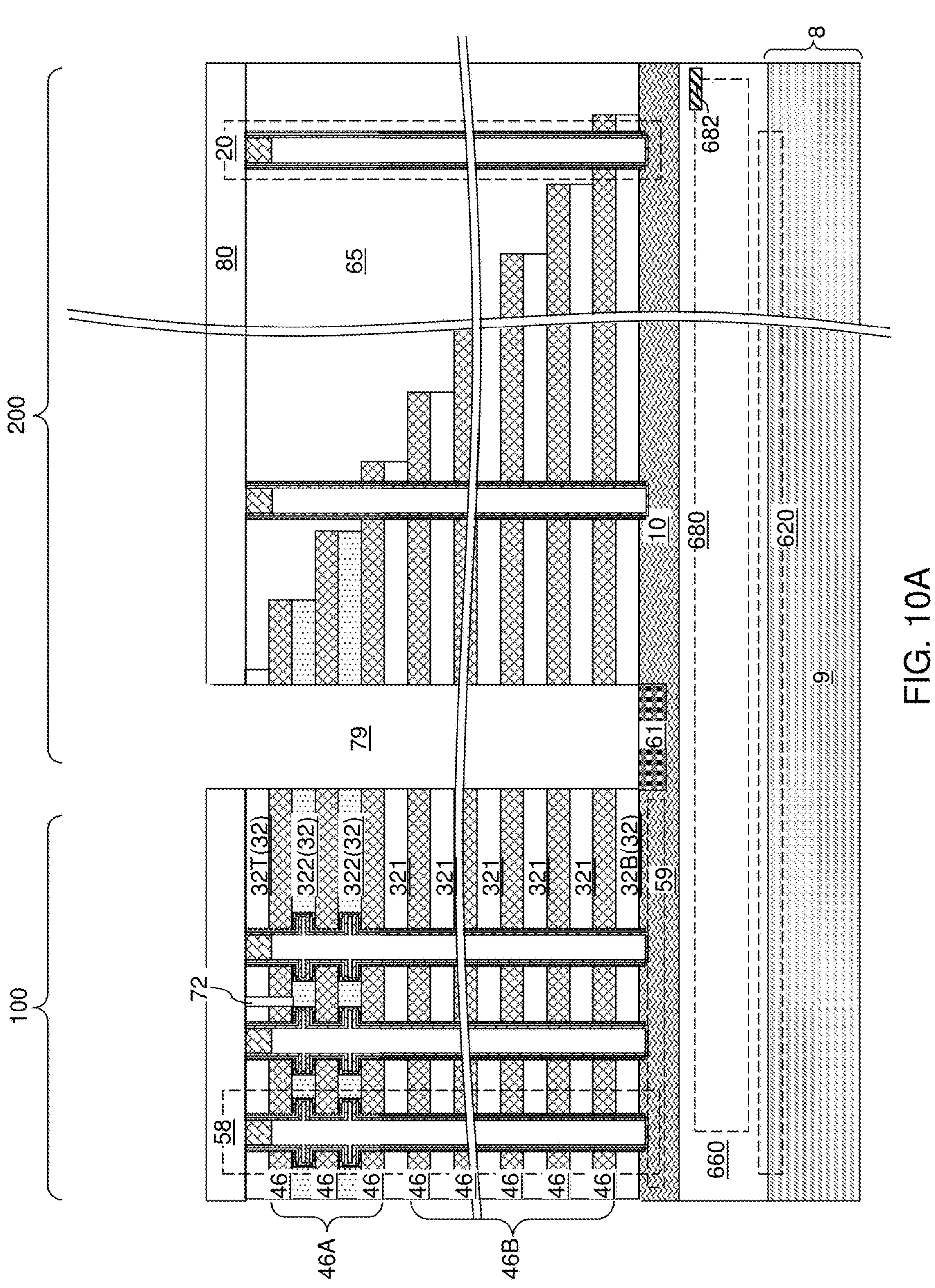
FIG. 10A is a vertical cross-sectional views of the first exemplary structure after formation of electrically conductive layers in the backside recesses according to the first embodiment of the present disclosure.
Figures 10B, 10C:
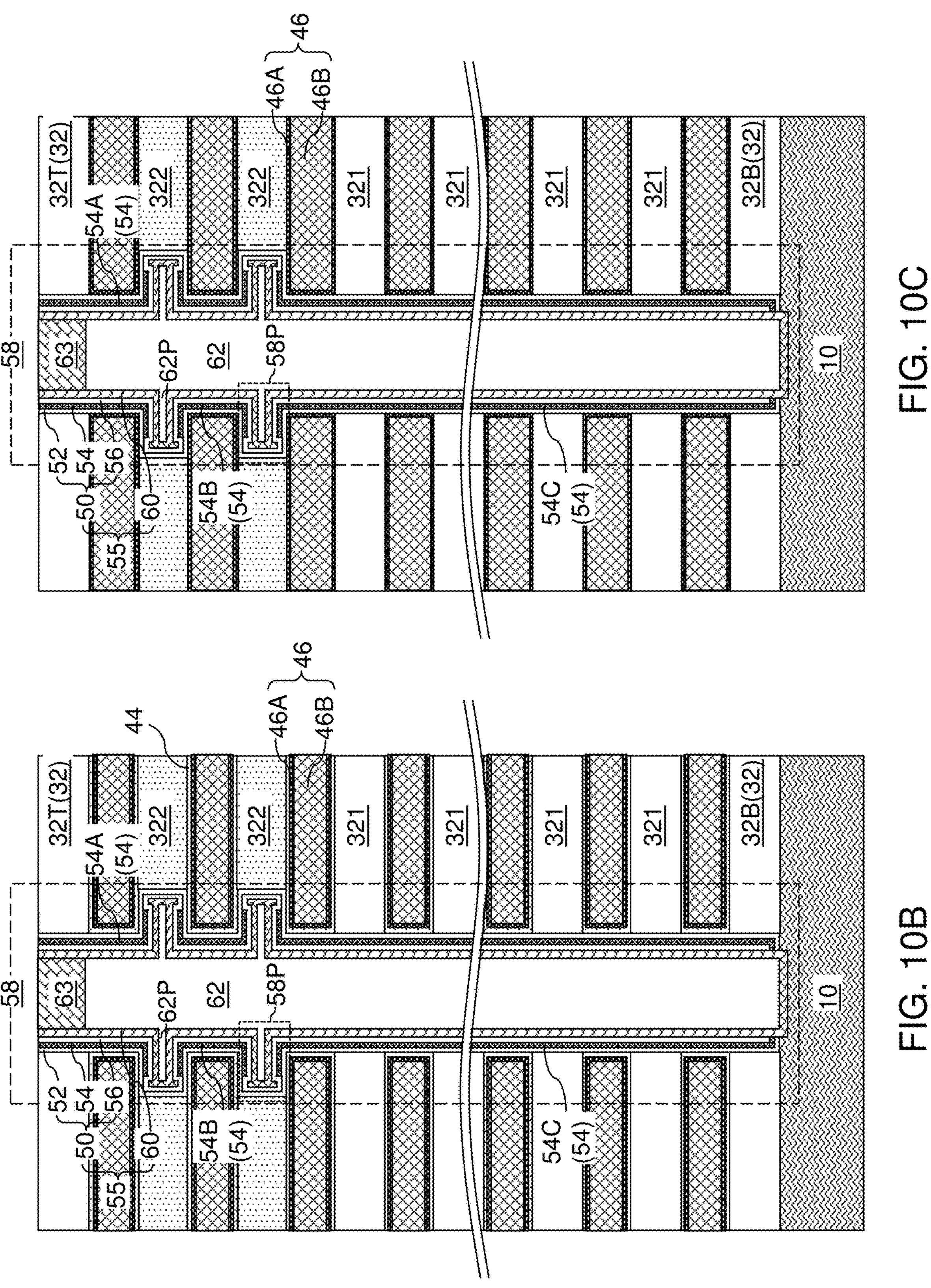
FIG. 10B is a magnified view of a region of a first configuration of the first exemplary structure after the processing steps of FIG. 10A.
FIG. 10C is a magnified view of a region of a second configuration of the first exemplary structure after the processing steps of FIG. 10A.

Referring to FIGS. 10A and 10B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, and the portions of the sidewall surfaces of the memory stack structures 55 that are physically exposed to the backside recesses 43. A backside cavity is present within the portion of each backside trench 79 that is not filled with the backside blocking dielectric layer 44.

At least one conductive material can be deposited in the backside recesses 43 by providing at least one reactant gas into the backside recesses 43 through the backside trenches 79. A metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in the plurality of backside recesses 43, on the sidewalls of the at least one the backside trench 79, and over the top surface of the contact-level dielectric layer 80 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer can be formed on the sidewalls of each backside trench 79 and over the contact-level dielectric layer 80. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer includes a continuous portion of the metallic barrier layer 46A and a continuous portion of the metallic fill material layer 46B that are located in the backside trenches 79 or above the contact-level dielectric layer 80.

The deposited metallic material of the continuous electrically conductive material layer is etched back from the sidewalls of each backside trench 79 and from above the contact-level dielectric layer 80 by performing an isotropic etch process that etches the at least one conductive material of the continuous electrically conductive material layer. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

In one embodiment, the removal of the continuous electrically conductive material layer can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer may not be selective to the material of the backside blocking dielectric layer 44 or, the backside blocking dielectric layer 44 may not be employed. A backside cavity is present within each backside trench 79. Each backside cavity continuous extends along the first horizontal direction hd1.

Referring to FIG. 10C, an alternative configuration of the first exemplary structure is illustrated, which can be derived from the first exemplary structure by omitting formation of the backside blocking dielectric layer 44.

Referring collectively to FIGS. 10A-10C, the sacrificial material layers 42 are replaced with the electrically conductive layers 46. Generally, an alternating stack (32, 46) of insulating layers 32 and electrically conductive layers 46 can be formed over the substrate 8. Each memory opening 49 vertically extends through the alternating stack (32, 46). Each memory opening fill structure 58 can be formed in a respective memory opening 49, and comprises a memory film 50 and a vertical semiconductor channel 60. Each memory film 50 may comprise portions of a plurality of charge storage material layers 54 (e.g., 54A-54C) that are vertically spaced apart.

The electrically conductive layers 46 comprise select gate electrodes and word lines for the memory film 50. One or more topmost electrically conductive layers 46 comprise drain side select gate electrodes and one or more bottommost electrically conductive layers 46 comprise source side select gate electrodes. The remaining electrically conductive layers located between the select gate electrodes may comprise word lines.

A memory device of the embodiments of the present disclosure may comprise an interference reduction feature for reducing neighboring word line or select gate electrode interference between vertically neighboring pairs of electrically conductive layers (e.g., word lines and/or select gate electrodes) 46 in first set without providing the interference reduction feature between vertically neighboring pairs of electrically conductive layers 46 in a second set. For example, the first set of the electrically conductive layers 46 maybe located at an upper level of the alternating stack (32, 46), while the second set of the electrically conductive layers 46 is located in middle and lower levels of the alternating stack (32, 46) below the upper levels. Thus, in one embodiment, the interference reduction feature is omitted in the middle and lower levels of the alternating stack.

In the first embodiment, the interference reduction feature comprises a vertical separation between the charge storage material layers 54 at the upper levels of the alternating stack (32, 46) in the same memory opening 49. Thus, the charge storage material layers 54 (e.g., 54B) adjacent to the electrically conductive layers 46 located in the upper levels of the alternating stack are discrete and vertically separated from adjacent charge storage material layers (e.g., 54A, 54C) located adjacent to vertically neighboring electrically conductive layers 46. In contrast, a continuous charge storage layer 54C continuously extends past plural electrically conductive layers 46 located in the middle and lower levels of the alternating stack (32, 46)

In one embodiment, the plurality of charge storage material layers 54 in one memory opening 49 comprises a first charge storage layer 54C that vertically extends through plural electrically conductive layers 46 of the second subset 46B of the electrically conductive layers 46 and a second charge storage material layer 54B that vertically extends through only one electrically conductive layer 46 in the first subset 46A of the electrically conductive layers 46.

In one embodiment, the memory opening fill structure 58 comprises a blocking dielectric layer 52 in direct contact with the insulating layers 32 and the electrically conductive layers 46, and in direct contact with the charge storage material layers 54. In one embodiment, the memory opening fill structure 58 comprises a dielectric core 62 that is laterally surrounded by the vertical semiconductor channel 60 and comprising laterally-protruding dielectric material portions that occupies a fraction of volumes of the lateral outward protrusions 58P.

Figure 11A:
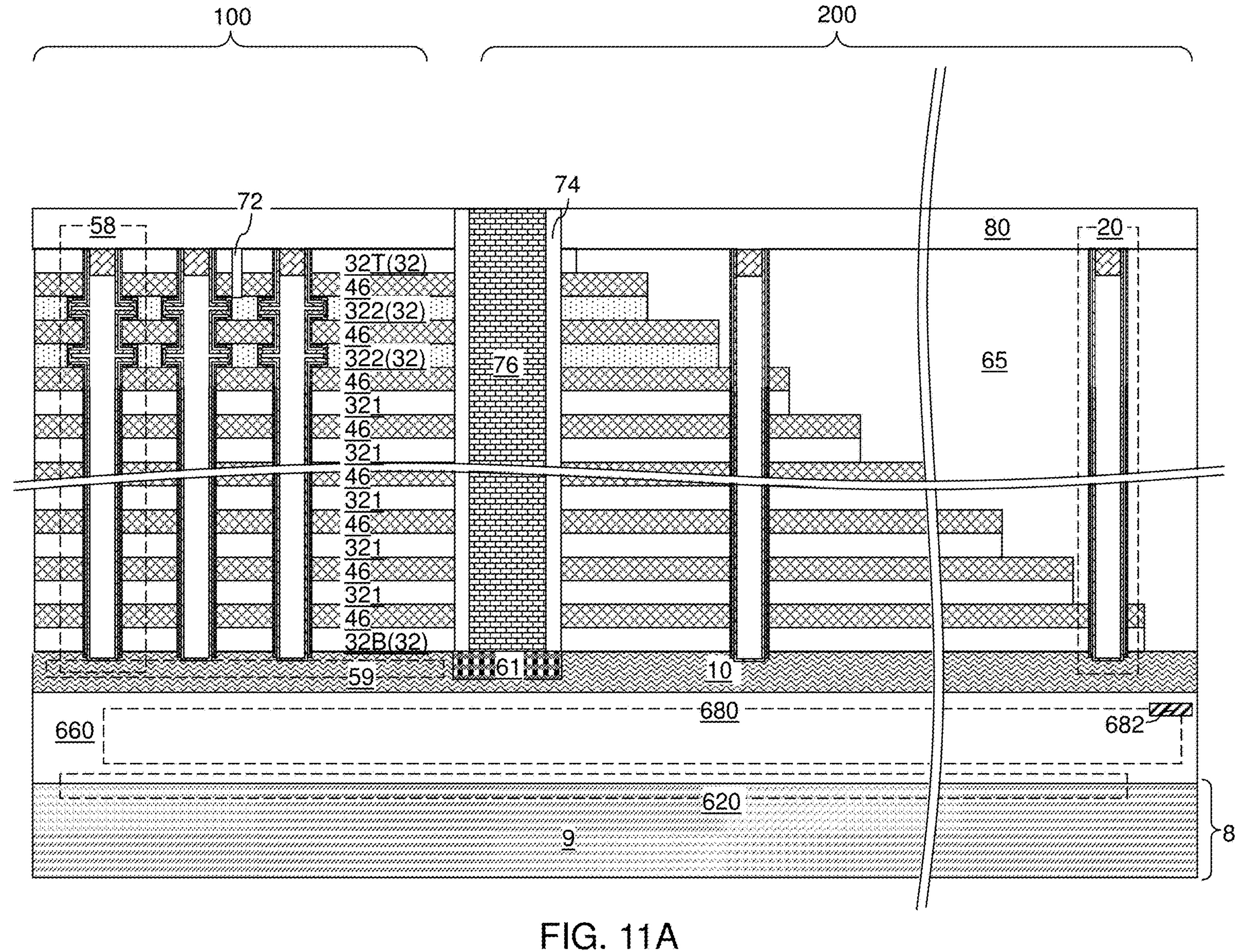
FIG. 11A is a schematic vertical cross-sectional view of the first exemplary structure after formation of backside trench fill structures according to the first embodiment of the present disclosure.
Figure 11B:
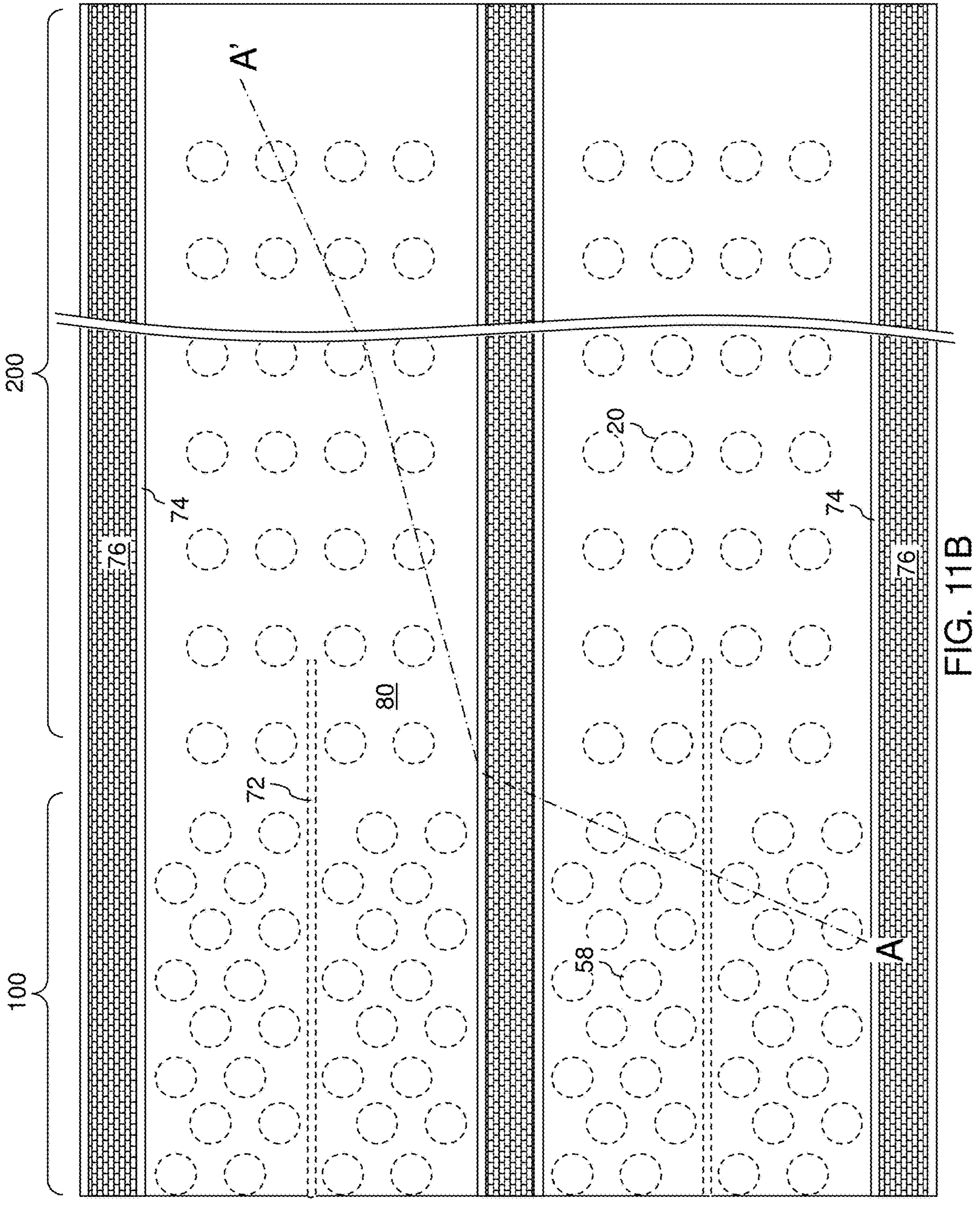
FIG. 11B is a top-down view of the first exemplary structure of FIG. 11A. The vertical plane A-A' is the plane of the schematic vertical cross-sectional view of FIG. 11A.

Referring to FIGS. 11A and 11B, an insulating material layer can be formed in the backside trenches 79 and over the contact-level dielectric layer 80 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact-level dielectric layer 80 and at the bottom of each backside trench 79. Each remaining portion of the insulating material layer constitutes an insulating spacer 74. A backside cavity is present within a volume surrounded by each insulating spacer 74.

A top surface of a source region 61 can be physically exposed at the bottom of each backside trench 79. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor material layer 10. Semiconductor channels (59, 60) extend between each source region 61 and a respective set of drain regions 63. The semiconductor channels (59, 60) include the vertical semiconductor channels 60 of the memory stack structures 55.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 80 overlying the alternating stack (32, 46) as a stopping layer. If chemical mechanical planarization (CMP) process is employed, the contact-level dielectric layer 80 can be employed as a CMP stopping layer. Each remaining continuous portion of the at least one conductive material in the backside trenches 79 constitutes a backside contact via structure 76. Each backside contact via structure 76 extends through the alternating stacks (32, 46), and contacts a top surface of a respective source region 61. If a backside blocking dielectric layer 44 is employed, each backside contact via structure 76 can contact a sidewall of the backside blocking dielectric layer 44.

Generally, a backside contact via structure 76 can be formed within each of the backside trenches 79 after formation of the insulating spacers 74 by depositing and planarizing at least one conductive material in volumes of the backside trenches 79 that are not filled with the insulating spacers 74.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 maybe omitted, and a horizontal source line (e.g., direct strap contact) may contact a side of the lower portion of the semiconductor channel 60.

Figure 12A:
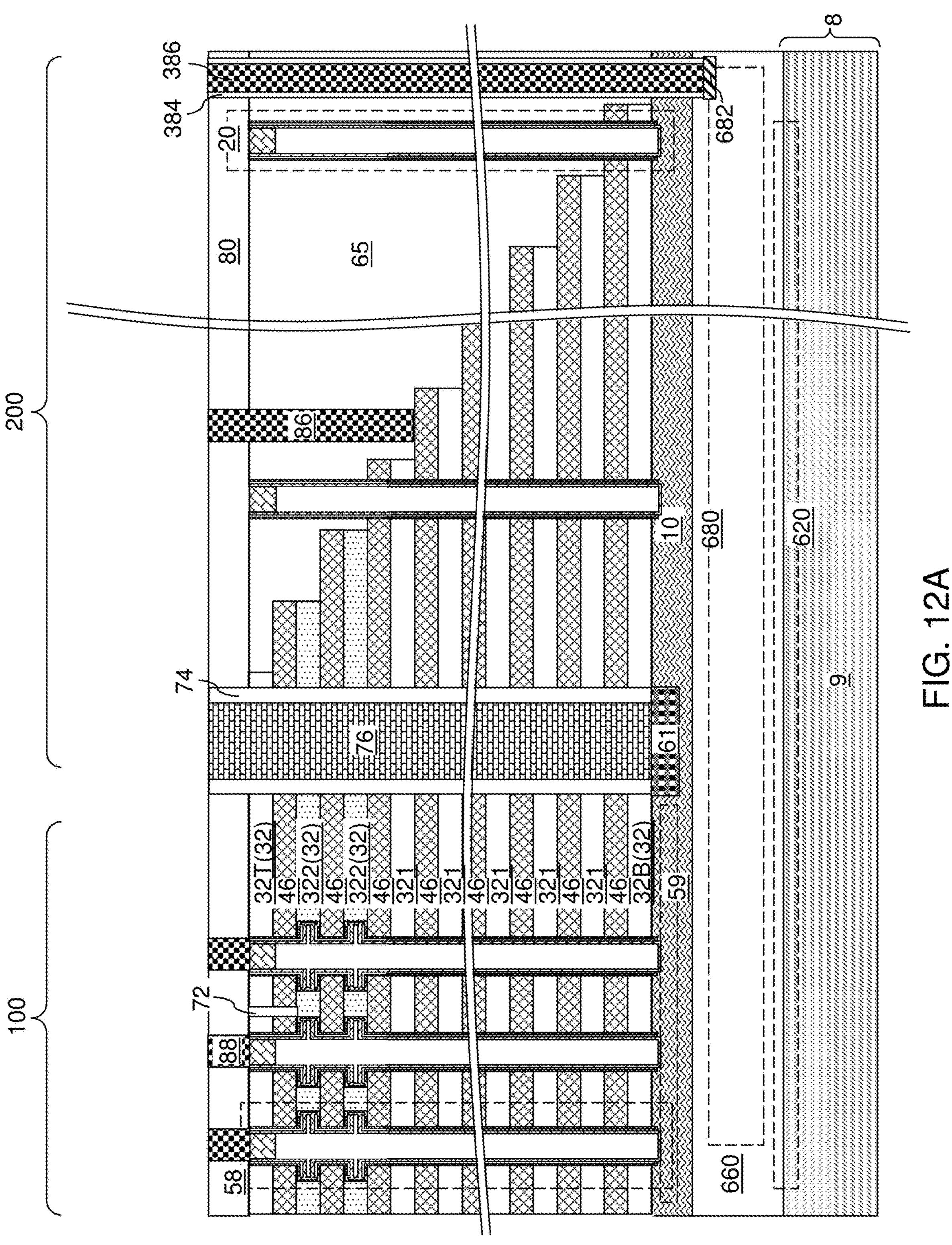
FIG. 12A is a schematic vertical cross-sectional view of the first exemplary structure after formation of additional contact via structures according to the first embodiment of the present disclosure.
Figure 12B:
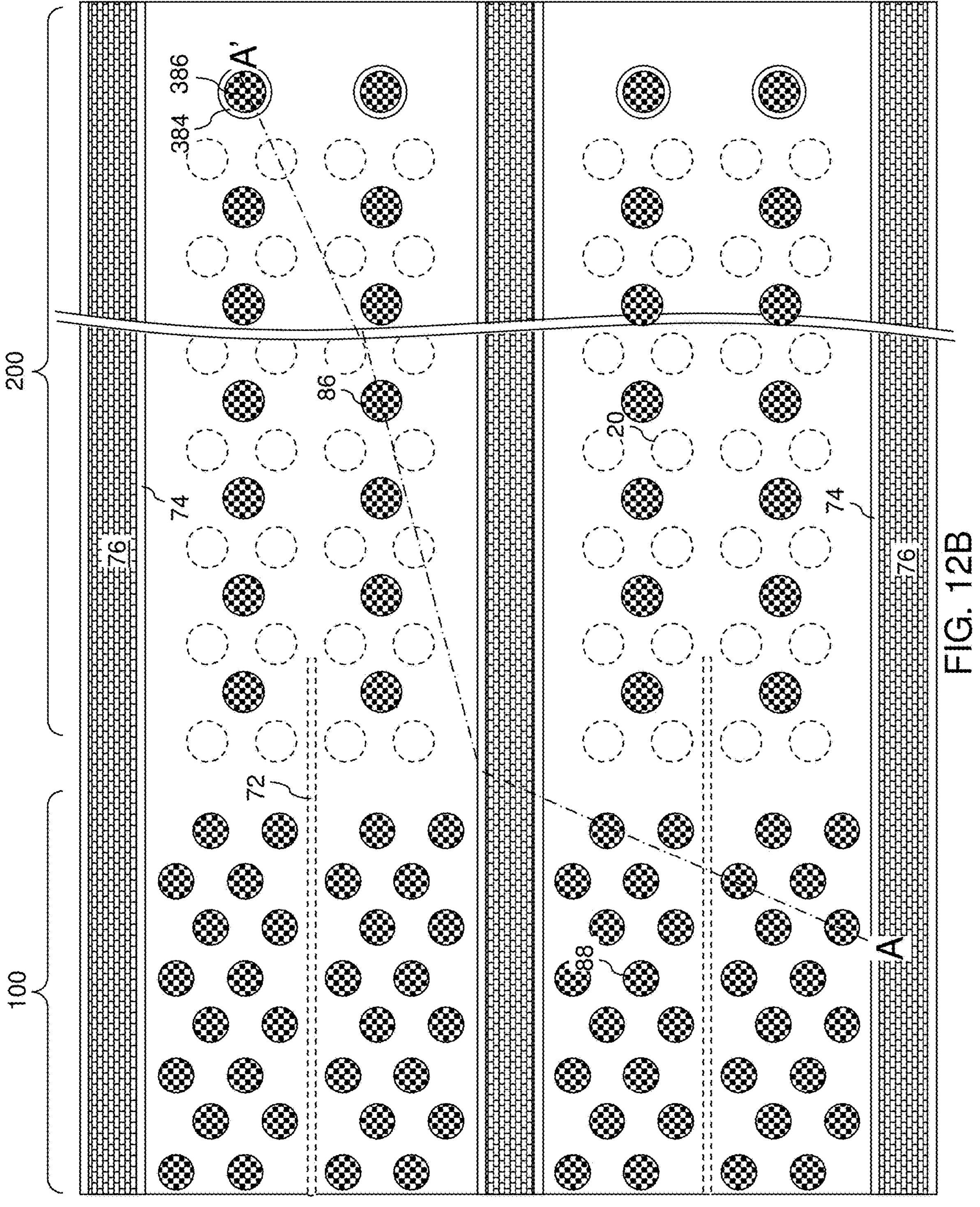
FIG. 12B is a top-down view of the first exemplary structure of FIG. 12A. The vertical plane A-A' is the plane of the schematic vertical cross-sectional view of FIG. 12A.

Referring to FIGS. 12A and 12B, additional contact via structures (88, 86, 386) can be formed through the contact-level dielectric layer 80, and optionally through the retro-stepped dielectric material portion 65. For example, drain contact via structures 88 can be formed through the contact-level dielectric layer 80 on each drain region 63. Layer contact via structures 86 can be formed on the electrically conductive layers 46 through the contact-level dielectric layer 80, and through the retro-stepped dielectric material portion 65. Through-memory-level connection via structures 386 can be formed through the retro-stepped dielectric material portion 65 and through the semiconductor material layer 10 directly on a respective metal pad 682. An insulating spacer 384 may be formed around each through-memory-level connection via structure 386 to electrically isolate the through-memory-level connection via structures 386 from the semiconductor material layer 10.

Figure 13:
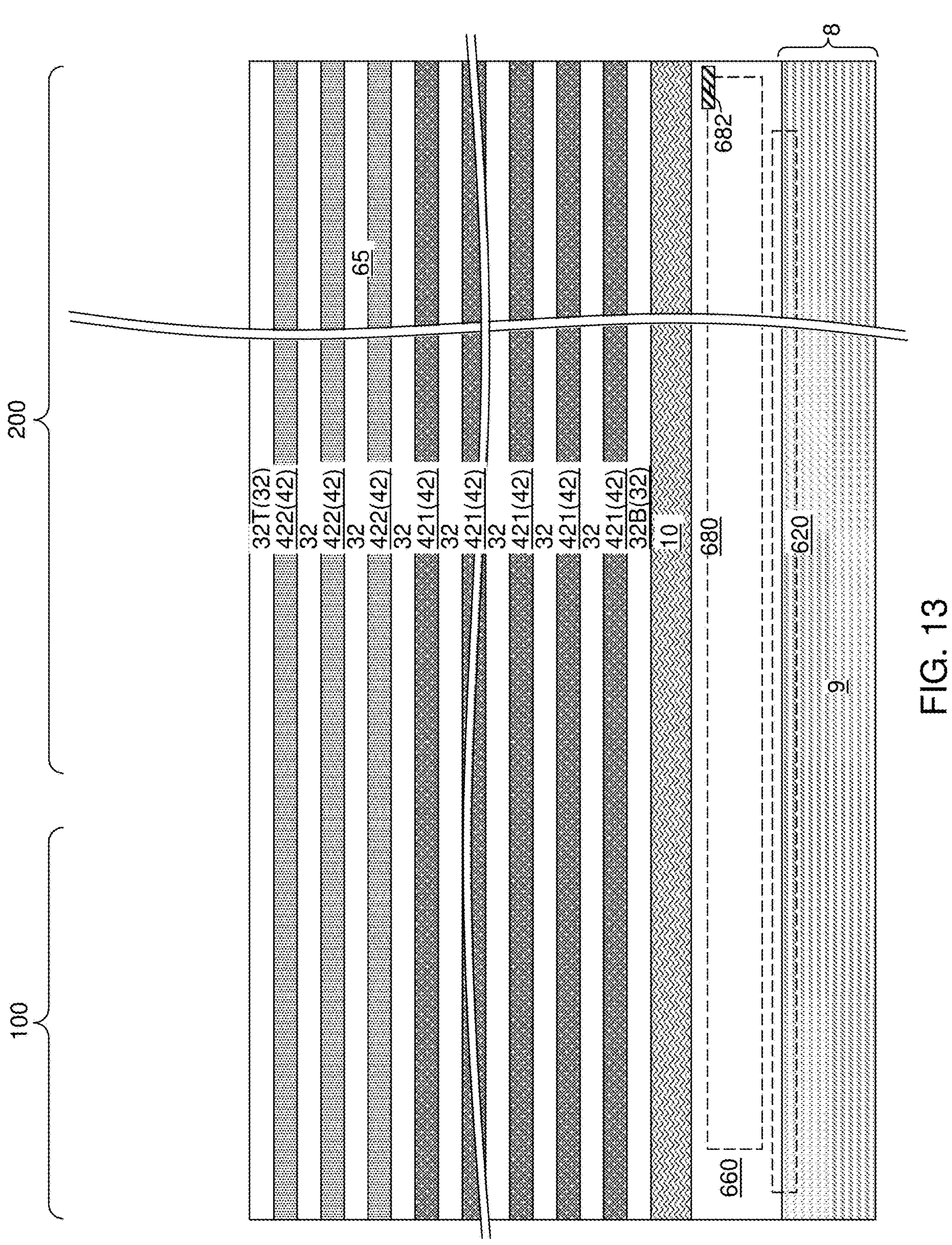
FIG. 13 is a schematic vertical cross-sectional view of a second exemplary structure after formation of optional semiconductor devices, optional lower-level metal interconnect structures, a semiconductor material layer, and an alternating stack of insulating layers and sacrificial material layers according to a second embodiment of the present disclosure.

Referring to FIG. 13, a second exemplary structure according to a second embodiment of the present disclosure can be derived from the first exemplary structure by employing the same material for all insulating layers 32, and by employing two types of sacrificial materials for the sacrificial material layers 42. Specifically, the sacrificial material layers 42 comprise first-type sacrificial material layers 421 comprising a first sacrificial material, and at least one second-type sacrificial material layer 422 comprising a second sacrificial material that is different from the first sacrificial material.

The at least one second-type sacrificial material layer 422 can be formed at each level at which reduction in neighboring word line interference (NWI) is desired. Such levels may include the upper levels of the alternating stack, including the level of the topmost sacrificial material layer 42, or a plurality of levels that includes the level of the topmost sacrificial material layer 42. Alternatively or additionally, the at least one second-type sacrificial material layer 422 may be formed at middle or lower levels of the alternating stack.

While an embodiment is described in which three second-type sacrificial material layers 422 are located at levels of sacrificial material layers 42 that underlie the topmost insulating layer 32T, embodiments are expressly contemplated herein in which different numbers of second-type sacrificial material layers 422 (such as 1, 3, 4, 5, 6, etc.) are employed, and/or the at least one second-type sacrificial material layer 422 is employed at any different level.

In an illustrative example, the first sacrificial material of the first sacrificial material layers 421 comprises a first silicon nitride material having a first etch rate in a wet etchant, and the second sacrificial material of the at least one second-type sacrificial material layer 422 comprises a second silicon nitride material having a second etch rate in the same etchant. The second etch rate is greater than the first etch rate by a factor of at least 3. In one embodiment, the etchant comprises 100:1 dilute hydrofluoric acid. While silicon oxide-based materials generally have higher etch rates in 100:1 dilute hydrofluoric acid than silicon nitride-based materials, some silicon nitride materials can have a higher etch rate than silicon oxide materials in 100:1 dilute hydrofluoric acid. Such high etch rate silicon nitride materials may be deposited by plasma-enhanced chemical vapor deposition under high plasma power which results in a relatively low density silicon nitride material. In contrast, low etch rate silicon nitride materials may be deposited by PECVD at a lower plasma power which results in a relatively high density silicon nitride material. For example, the second-type sacrificial material layers 422 comprise a second silicon nitride material having a density that is lower by at least 5%, such as 5 to 15%, for example 7 to 10% than the density of first sacrificial material layers 421. In this case, the lower density second-type sacrificial material layers 422 may have a higher etch rate in 100:1 dilute hydrofluoric acid than the silicon oxide insulating layers 32 and the higher density first sacrificial material layers 421.

Figure 14:
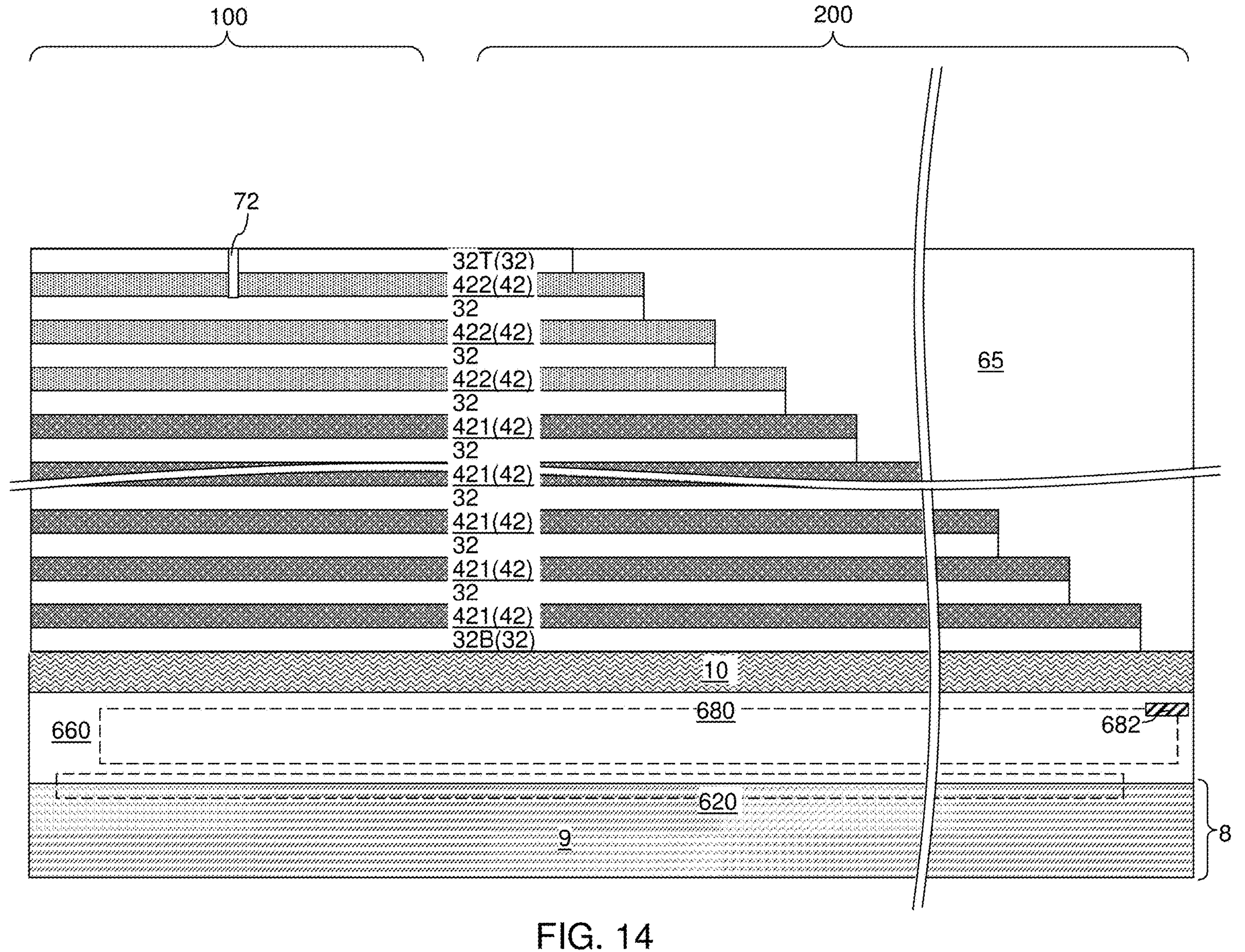
FIG. 14 is a schematic vertical cross-sectional view of the second exemplary structure after formation of stepped surfaces and a retro-stepped dielectric material portion according to the second embodiment of the present disclosure.

Referring to FIG. 14, the processing steps of FIGS. 2 and 3 can be performed to pattern the alternating stack (32, 42), and to form a retro-stepped dielectric material portion 65.

Figure 15A:
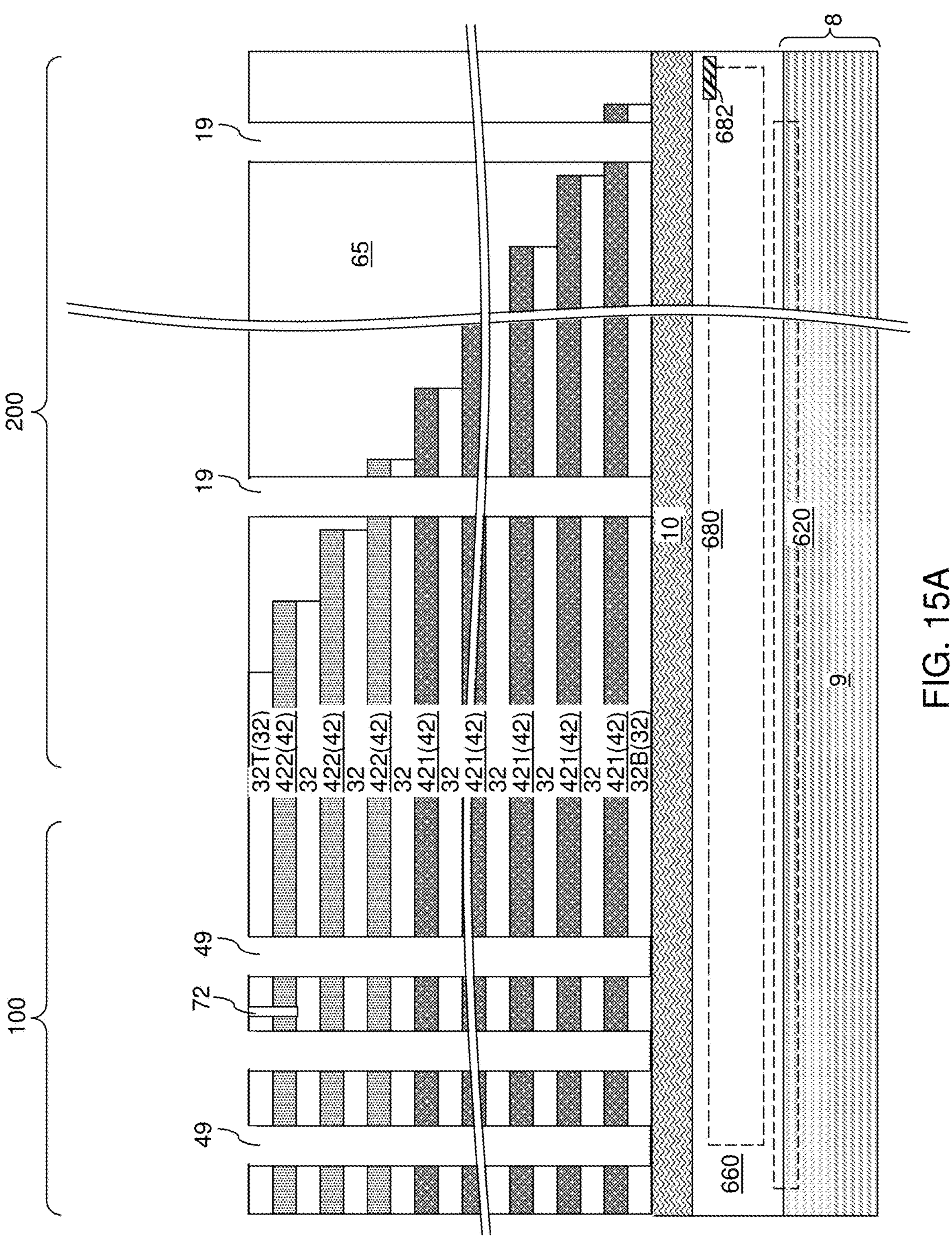
FIG. 15A is a schematic vertical cross-sectional view of the second exemplary structure after formation of memory openings and support openings according to the second embodiment of the present disclosure.
Figure 15B:
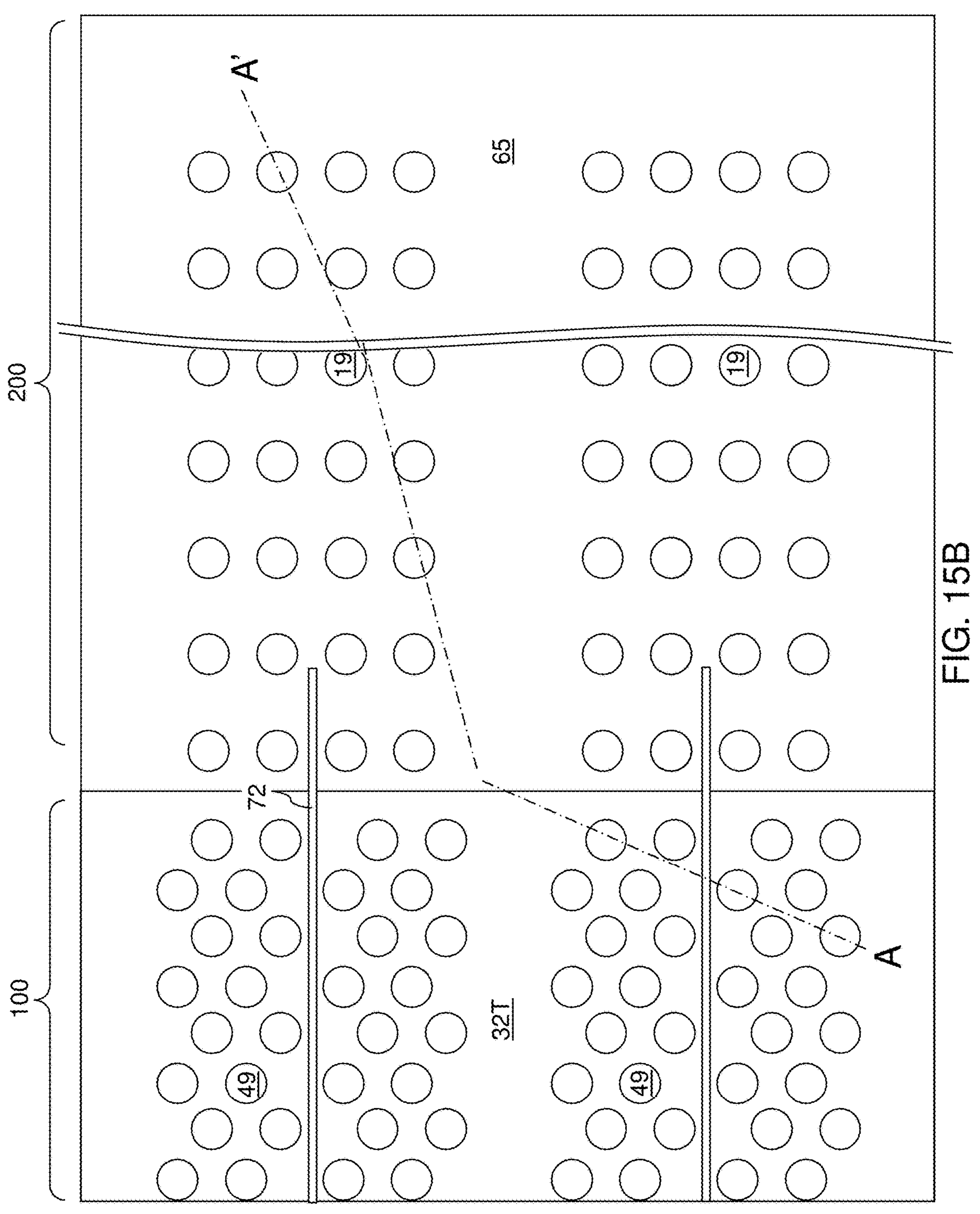
FIG. 15B is a top-down view of the second exemplary structure of FIG. 15A. The vertical plane A-A' is the plane of the cross-section for FIG. 15A.

Referring to FIGS. 15A and 15B, the processing steps of FIGS. 4A and 4B can be performed to form memory openings 49 and support openings 19.

Figure 16:
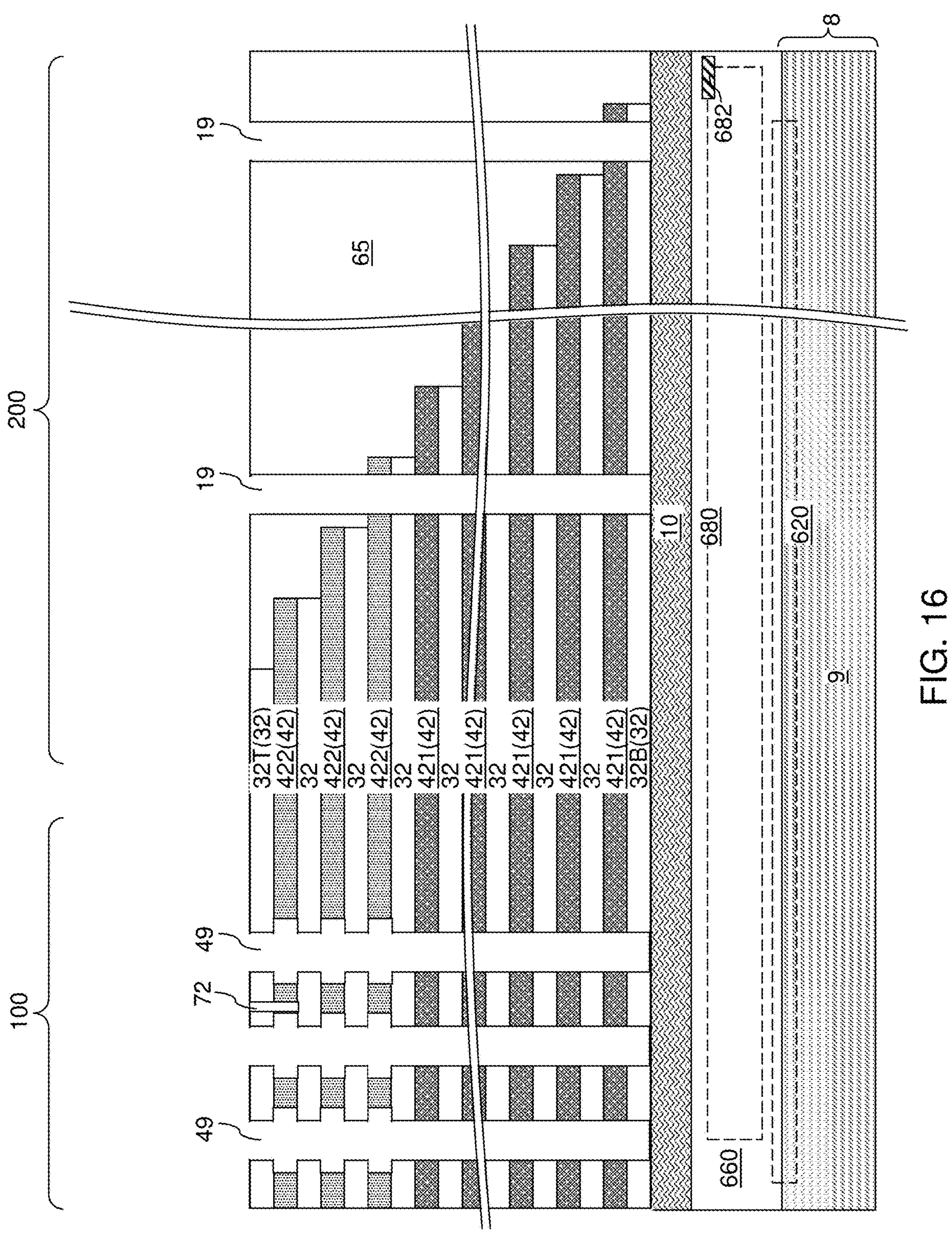
FIG. 16 is a schematic vertical cross-sectional view of the second exemplary structure after laterally recessing second-type sacrificial material layers around the memory openings according to the second embodiment of the present disclosure.
Figures 17A, 17B:
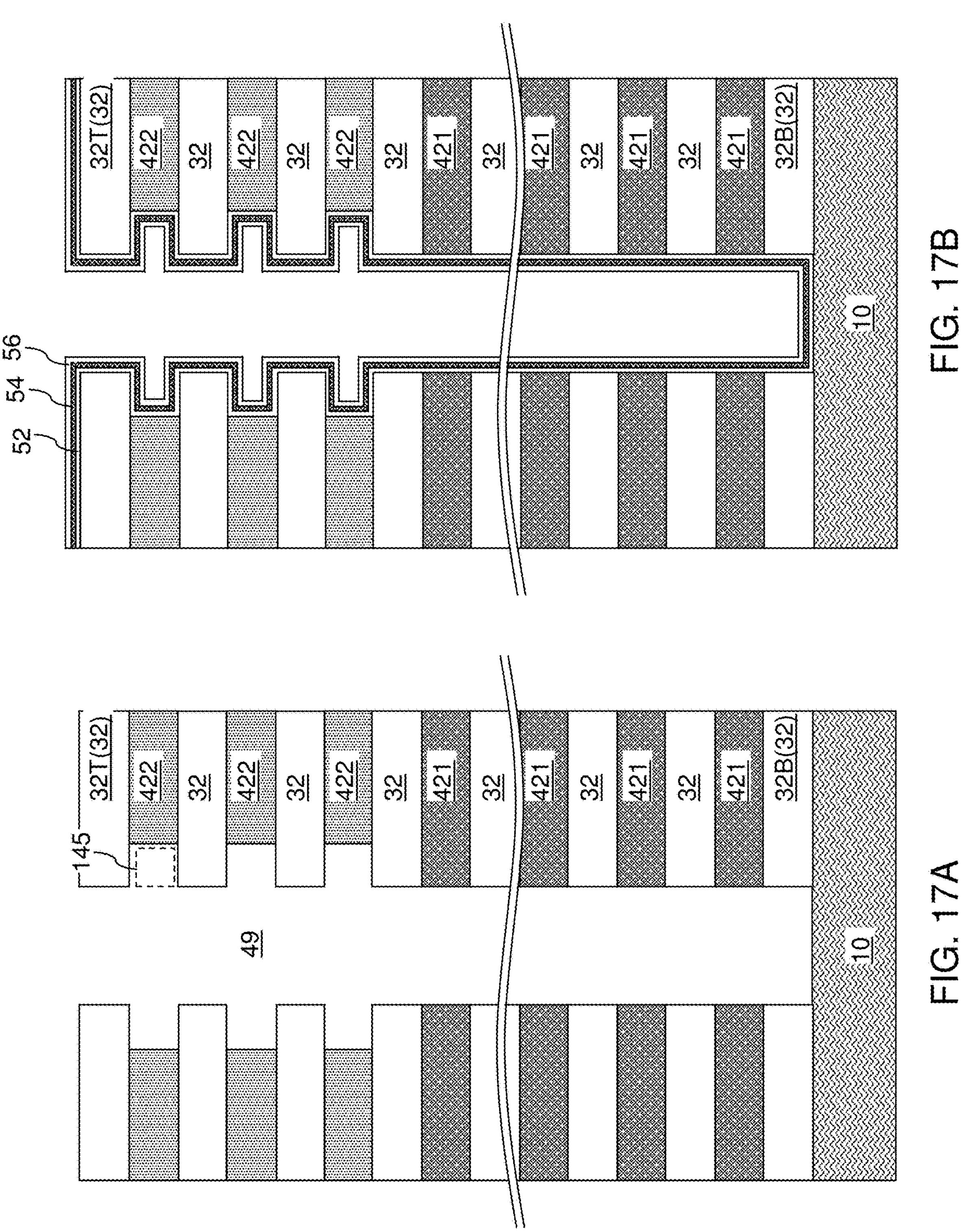
FIGS. 17A-17F are sequential schematic vertical cross-sectional views of a memory opening within the second exemplary structure during formation of a memory opening fill structure according to the second embodiment of the present disclosure.

Referring to FIGS. 16 and 17A, an isotropic etch process can be performed to laterally recess the second-type sacrificial material layers 422 selective to materials of the first-type sacrificial material layers 421 and the insulating layers 32. At least one lateral recess 145 can be formed at each level of the at least one second-type sacrificial material layer 422 upon laterally expanding the memory opening 49 at each level of the at least one second-type sacrificial material layer 422.

The isotropic etch process may comprise a wet etch process employing 100:1 dilute hydrofluoric acid, or a hydrofluoric acid solution having a different dilution. The lateral recess distance of the lateral recesses 145 may be in a range from 1 nm to 20 nm, such as from 2 nm to 10 nm, although lesser and greater lateral recess distances may also be employed. Each of the lateral recesses 145 may have an annular configuration, and is adjoined to a respective memory opening 49.

Referring to FIG. 17B, an optional blocking dielectric layer 52, a charge storage material layer 54, and a tunneling dielectric layer 56 can be sequentially deposited in each memory opening 49 by performing a respective conformal deposition process (such as a chemical vapor deposition process or an atomic layer deposition process). Generally, each of the blocking dielectric layer 52, the charge storage material layer 54, and the tunneling dielectric layer 56 in the second exemplary structure may have the same material composition, and the same thickness range, as in the first exemplary structure. In the second exemplary structure, the charge storage material layer 54 may comprise silicon nitride or any other alternative charge storage material.

Figure 17D:
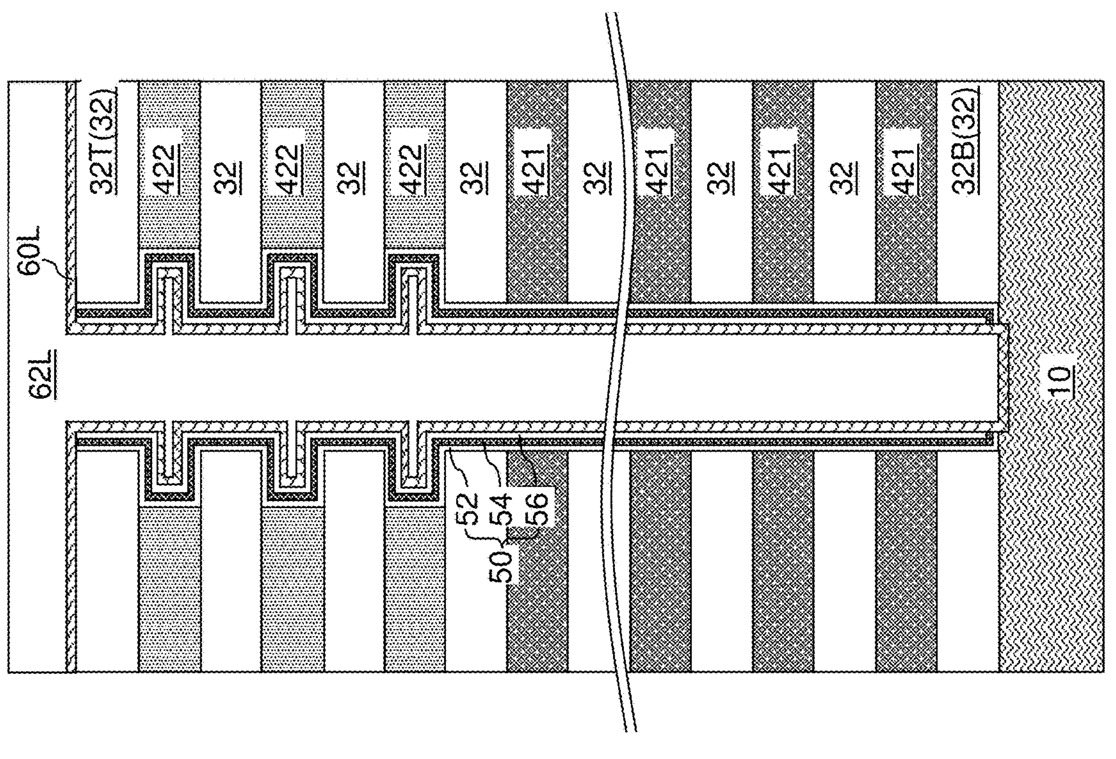
Figure 17C:

Referring to FIG. 17C, the processing steps described with reference to FIG. 6I can be performed to remove horizontally-extending portions of the blocking dielectric layer 52, the charge storage material layer 54, and the tunneling dielectric layer 56. The combination of remaining portions of the blocking dielectric layer 52, the charge storage material layer 54, and the tunneling dielectric layer 56 in each memory opening 49 constitutes a memory film 50. Each memory film 50 comprises a lateral outward protrusion 58Q at each level of the second-type sacrificial material layers 422 relative to a respective overlying insulating layer 32 and a respective underlying insulating layer 32. Each lateral outward protrusion 58Q increases the physical distance within the charge storage material layer 54 between portions of the charge storage material layer 54 that are subsequently employed to store electrical charges, i.e., portions that are adjacent to the sacrificial material layers 42. Thus, the lateral outward protrusions 58Q function as a feature that decreases NWI at the levels of the second-type sacrificial material layers 422, since electrons would have a longer path to travel to an adjacent memory element (i.e., adjacent memory cell) around the protrusion 58Q in the charge storage material layer 54. Thus, the leakage current and NWI is reduced at the upper levels of the alternating stack where the layers may be thinner than at the bottom levels.

Referring to FIG. 17D, the processing steps described with reference to FIG. 6J can be performed to form a semiconductor channel layer 60L and a dielectric core layer 62L.

Figure 17F:
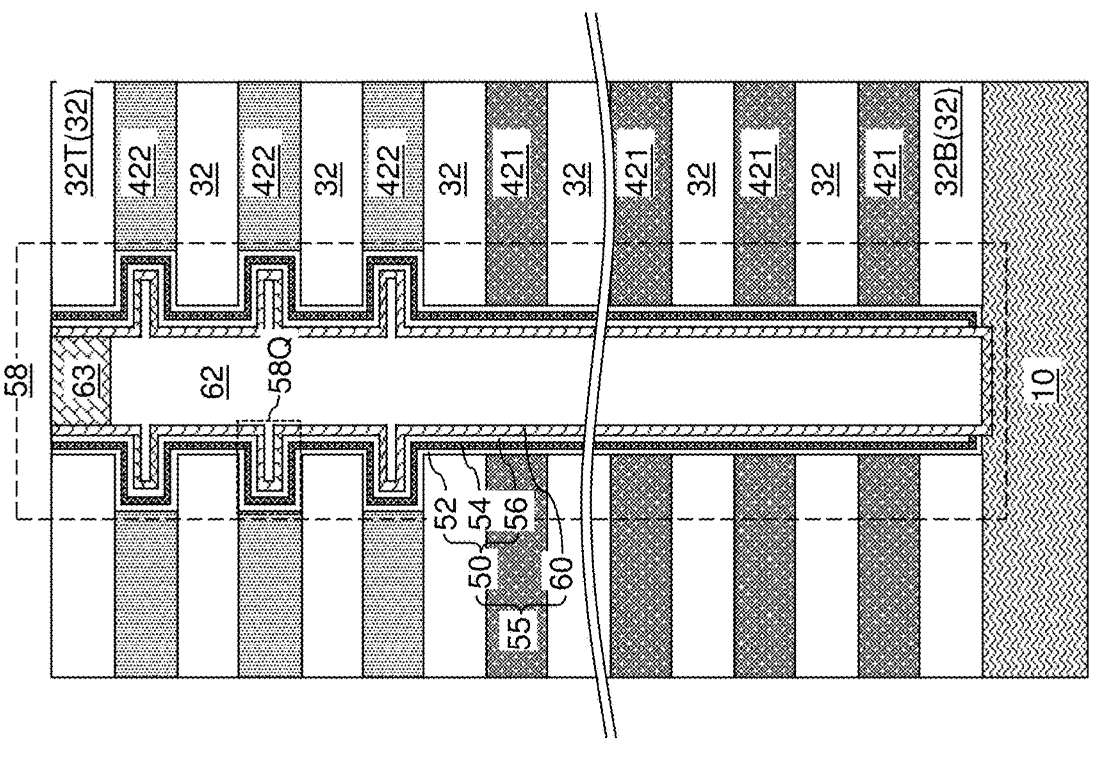
Figure 17E:

Referring to FIG. 17E, the processing steps described with reference to FIG. 6K can be performed to form a dielectric core 62 within each memory opening 49.

Referring to FIG. 17F, the processing steps described with reference to FIG. 6L can be performed to form a vertical semiconductor channel 60 and a drain region 63 within each memory opening 49.

Figure 18:
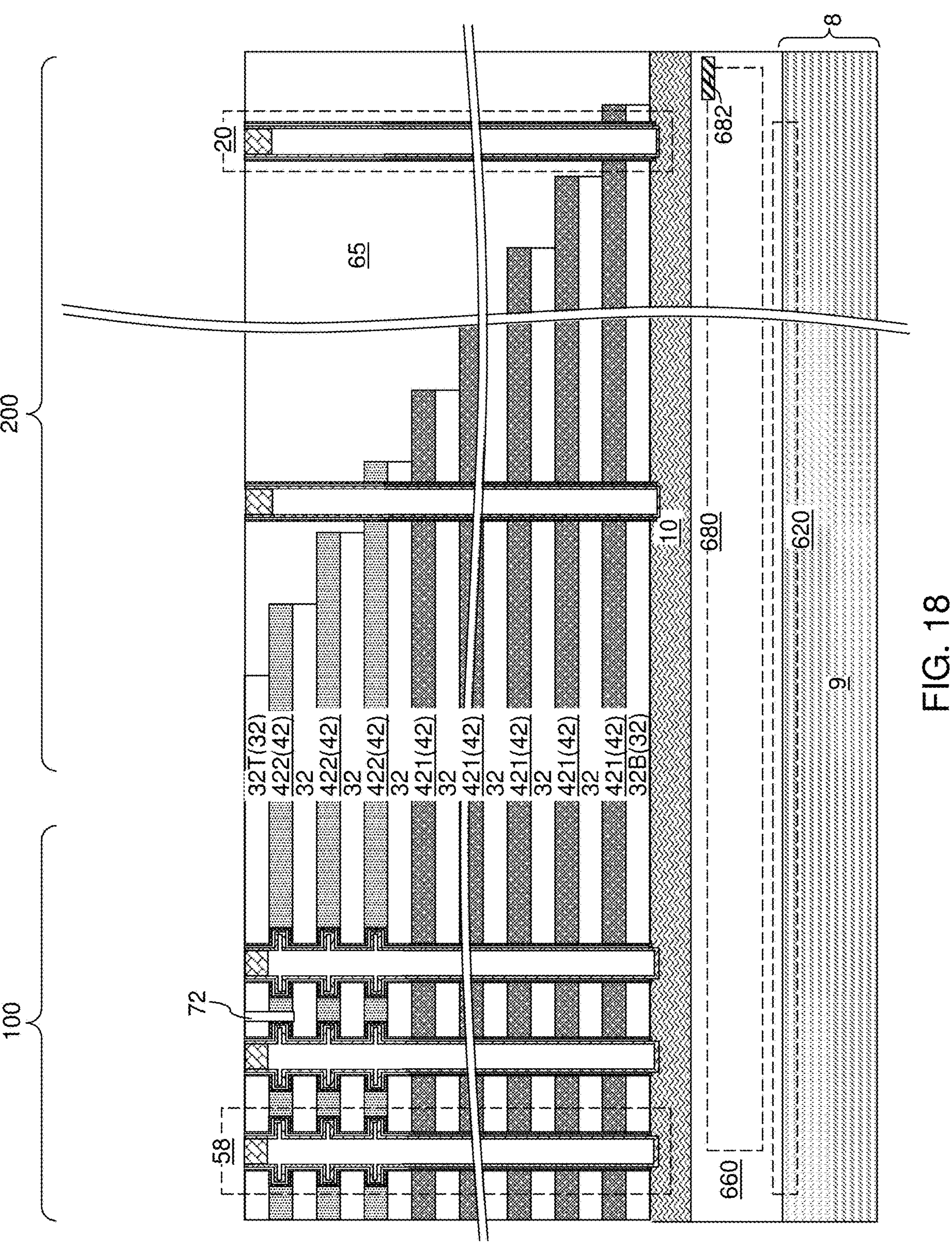
FIG. 18 is a schematic vertical cross-sectional view of the second exemplary structure after formation of memory opening fill structures and support pillar structures according to the second embodiment of the present disclosure.

Referring to FIG. 18, the second exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIG. 16. An instance of the support pillar structure 20 can be formed within each support opening 19 of the structure of FIG. 16.

Figure 19:
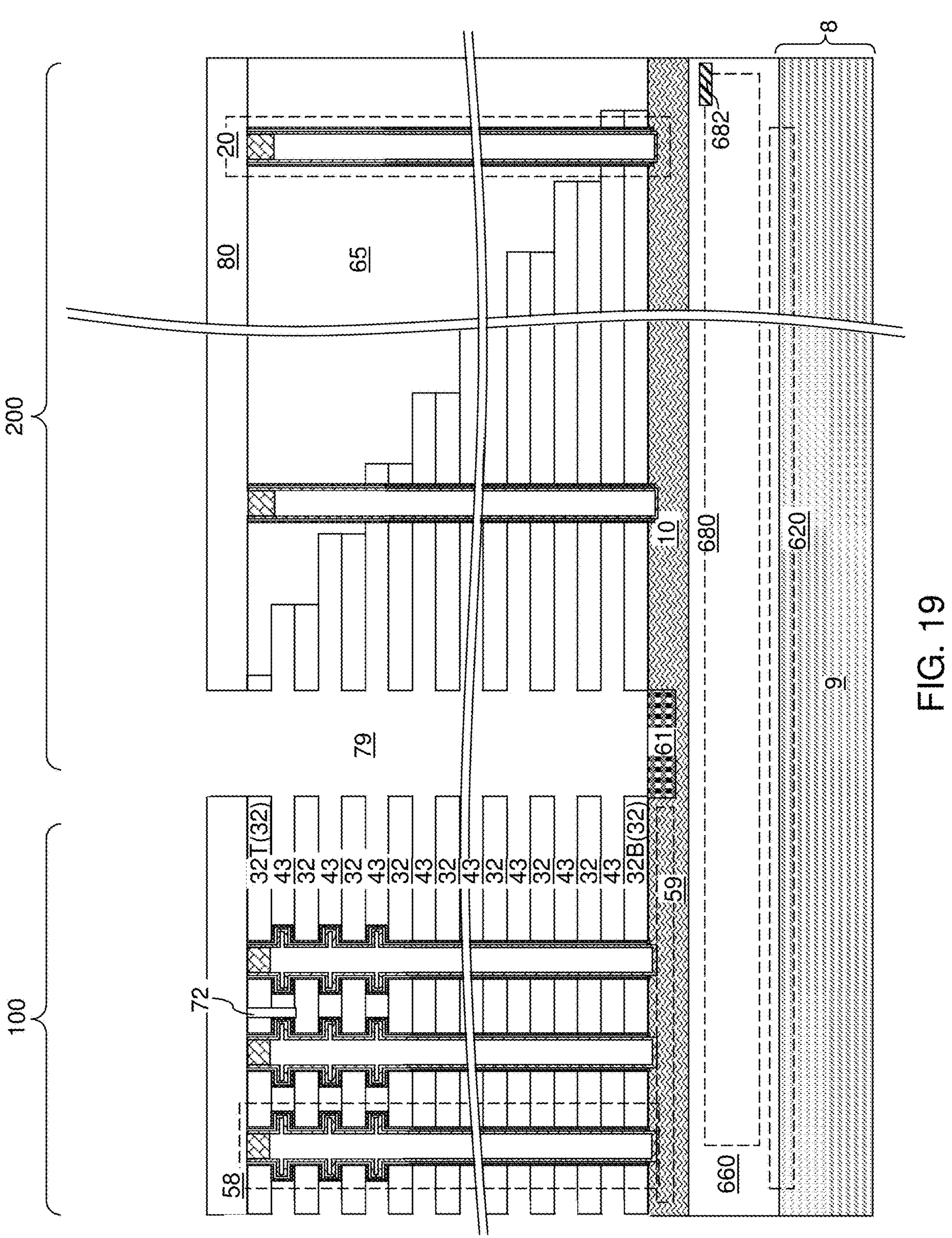
FIG. 19 is a schematic vertical cross-sectional view of the second exemplary structure after formation of backside trenches and backside recesses according to the second embodiment of the present disclosure.

Referring to FIG. 19, the processing steps described with reference to FIGS. 8A, 8B, and 9 can be performed to form backside trenches 79, to form source regions 61, and to form backside recesses 43.

Figure 20A:
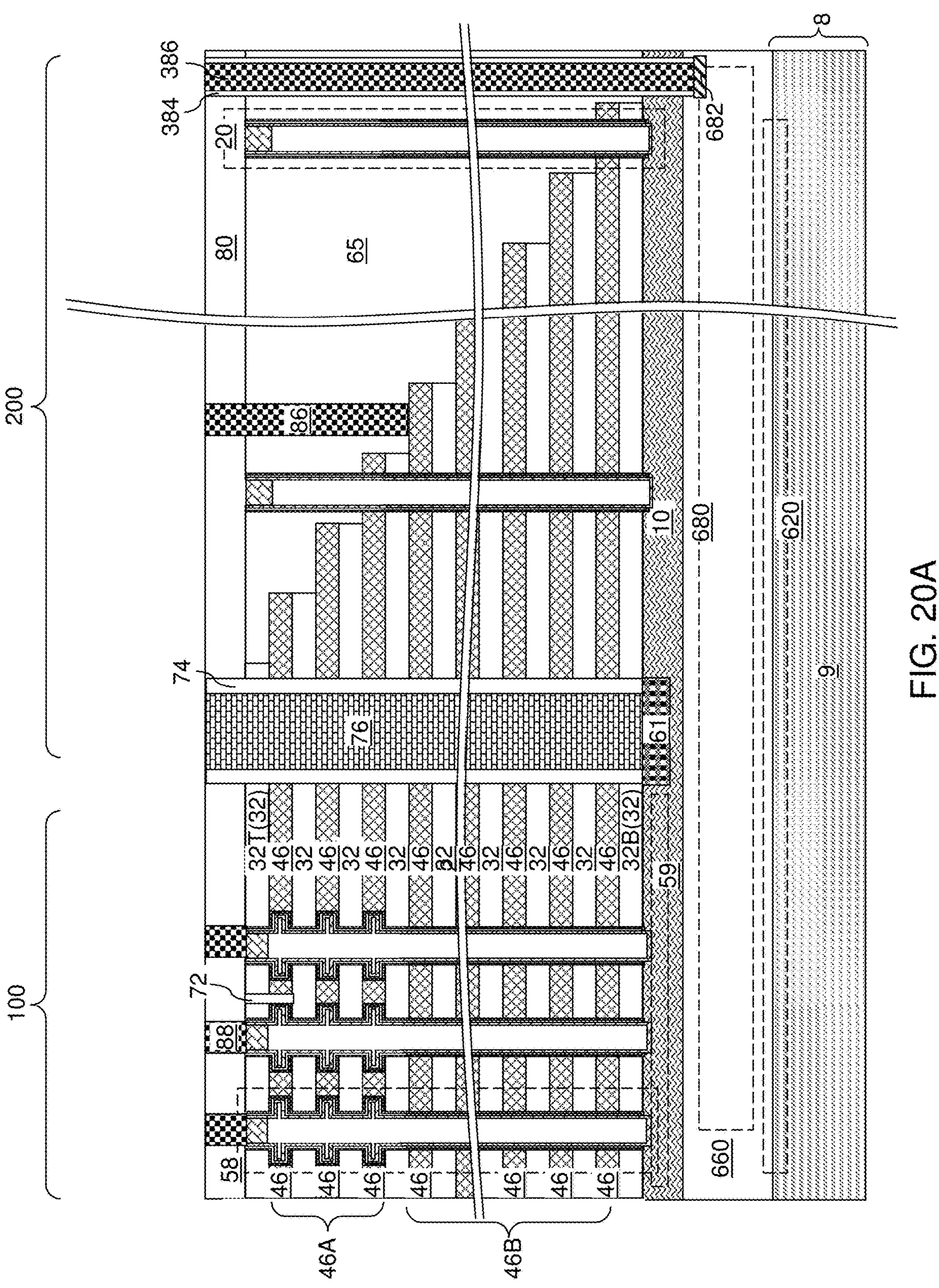
FIG. 20A is a vertical cross-sectional views of the second exemplary structure after formation of electrically conductive layers and various contact via structures according to the second embodiment of the present disclosure.
Figures 20B, 20C:
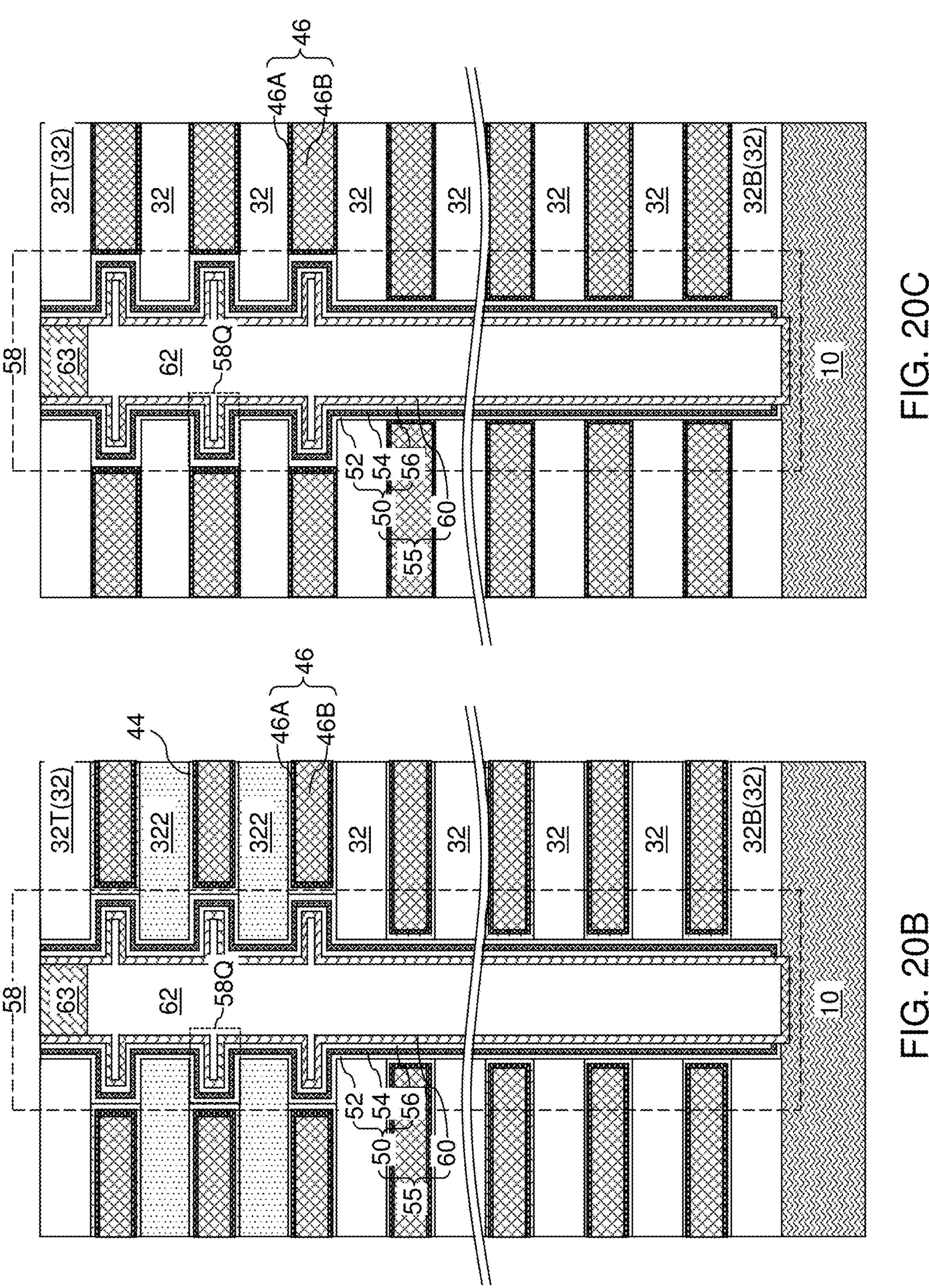
FIG. 20B is a magnified view of a region of a first configuration of the second exemplary structure after the processing steps of FIG. 20A.
FIG. 20C is a magnified view of a region of a second configuration of the second exemplary structure after the processing steps of FIG. 20A.

Referring to FIGS. 20A and 20B, the processing steps described with reference to FIGS. 10A and 10B, 11A and 11B, and 12A and 12B can be performed to form electrically conductive layers 46 in the backside recesses 43, to form backside trench fill structures (74, 76), and to form various contact via structures (86, 88, 386).

Referring to FIG. 20C, an alternative configuration of the second exemplary structure can be derived from the second exemplary structure by omitting formation of the backside blocking dielectric layer 44.

Generally, the memory device comprises an interference reduction feature (e.g., the lateral protrusion 58Q in the memory opening fill structure) for reducing NWI for a first subset of electrically conductive layers 46 without providing the interference reduction feature for a second subset of the electrically conductive layers 46 that is a complement of the first subset. The first subset of the electrically conductive layers 46 is formed by replacement of the second-type sacrificial material layers 422. The second subset of the electrically conductive layers 46 is formed by replacement of the first-type sacrificial material layers 421.

Each memory opening fill structure 58 can comprise a lateral outward protrusion 58Q at each level of the first subset of the electrically conductive layers 46 relative to a respective overlying insulating layer 32 and a respective underlying insulating layer 32. In one embodiment, a charge storage material layer 54 continuously extends through each of the electrically conductive layers 46. The lateral outward protrusion increases the physical distance within the charge storage material layer 54 between adjacent memory cells at the levels of the first subset of the electrically conductive layers 46, and thus, decrease NWI.

FIGS. 21A-21F are sequential vertical cross-sectional views of a region of a third exemplary structure during formation of a memory opening fill structure 58 according to a third embodiment of the present disclosure.

Figures 21A, 21B:
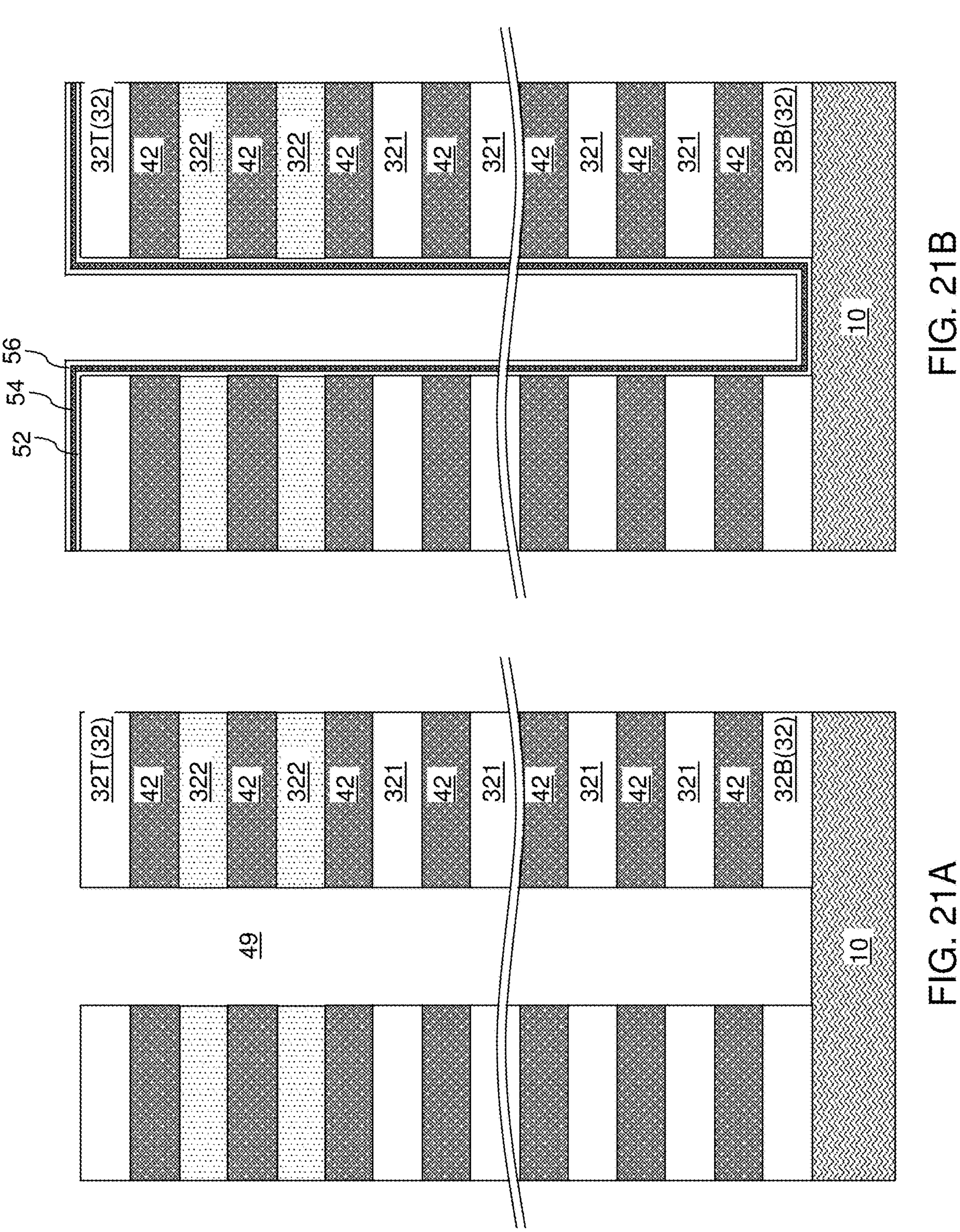
FIGS. 21A-21F are sequential vertical cross-sectional views of a region of a third exemplary structure during formation of a memory opening fill structure according to a third embodiment of the present disclosure.

The third exemplary structure illustrated in FIG. 21A can be derived from the first exemplary structure illustrated in FIGS. 4A and 4B by replacing each second-type insulating layers 322 of the first exemplary structure with a respective second-type insulating layer 323. According to an aspect of the present disclosure, the first-type insulating layers 321 comprise a first insulating material having a first dielectric constant, and each second-type insulating layer 322 comprises a second insulating material having a second dielectric constant that is less than the first dielectric constant. In an illustrative example, the first-type insulating layers 321 comprises undoped silicate glass, and each second-type insulating layer 323 comprises porous or non-porous organosilicate glass or another low-dielectric-constant material, having a dielectric constant less than 3.7. The processing steps described with reference to FIGS. 5 and 6A are omitted in the third embodiment of the present disclosure.

Referring to FIG. 21B, the processing steps described with reference to FIG. 17B can be performed to sequentially deposit an optional blocking dielectric layer 52, a charge storage material layer 54, and a tunneling dielectric layer 56 in each memory opening 49.

Figures 21C, 21D:
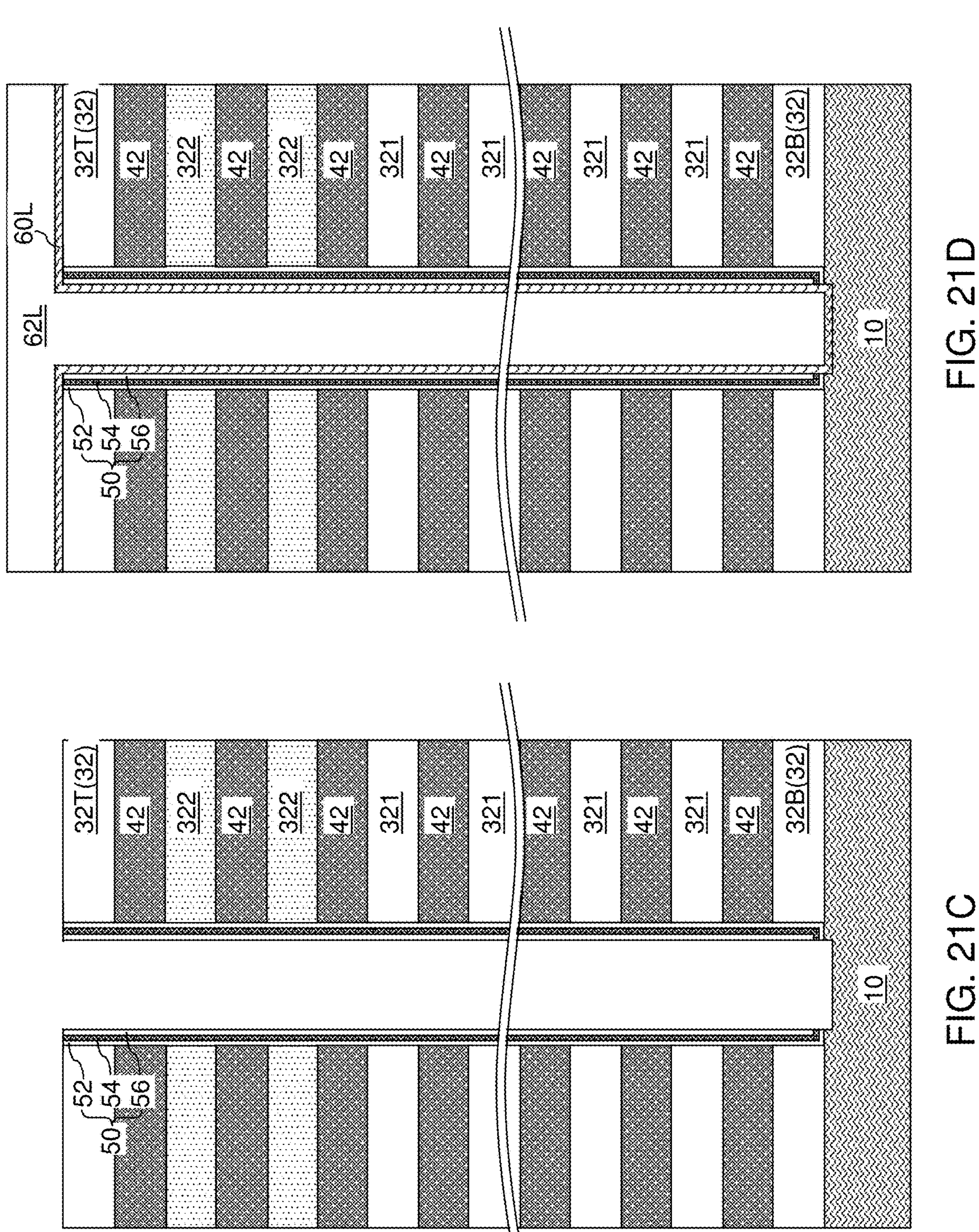

Referring to FIG. 21C, the processing steps described with reference to FIG. 17C can be performed to remove horizontally-extending portions of the blocking dielectric layer 52, the charge storage material layer 54, and the tunneling dielectric layer 56. The combination of remaining portions of the blocking dielectric layer 52, the charge storage material layer 54, and the tunneling dielectric layer 56 in each memory opening 49 constitutes a memory film 50. The low dielectric constant of the at least one second-type insulating layer 323 reduces electrical coupling between the neighboring electrically conductive layers to be subsequently formed above and below the at least one second-type insulating layer 323. Thus, the low dielectric constant second-type insulating layer 323 comprises the interference reduction feature that decreases neighboring interference (NWI) between neighboring electrically conductive layers at the level(s) of the second-type insulating layer(s) 323.

Referring to FIG. 21D, the processing steps described with reference to FIG. 17D can be performed to form a semiconductor channel layer 60L and a dielectric core layer 62L.

Figures 21E, 21F:
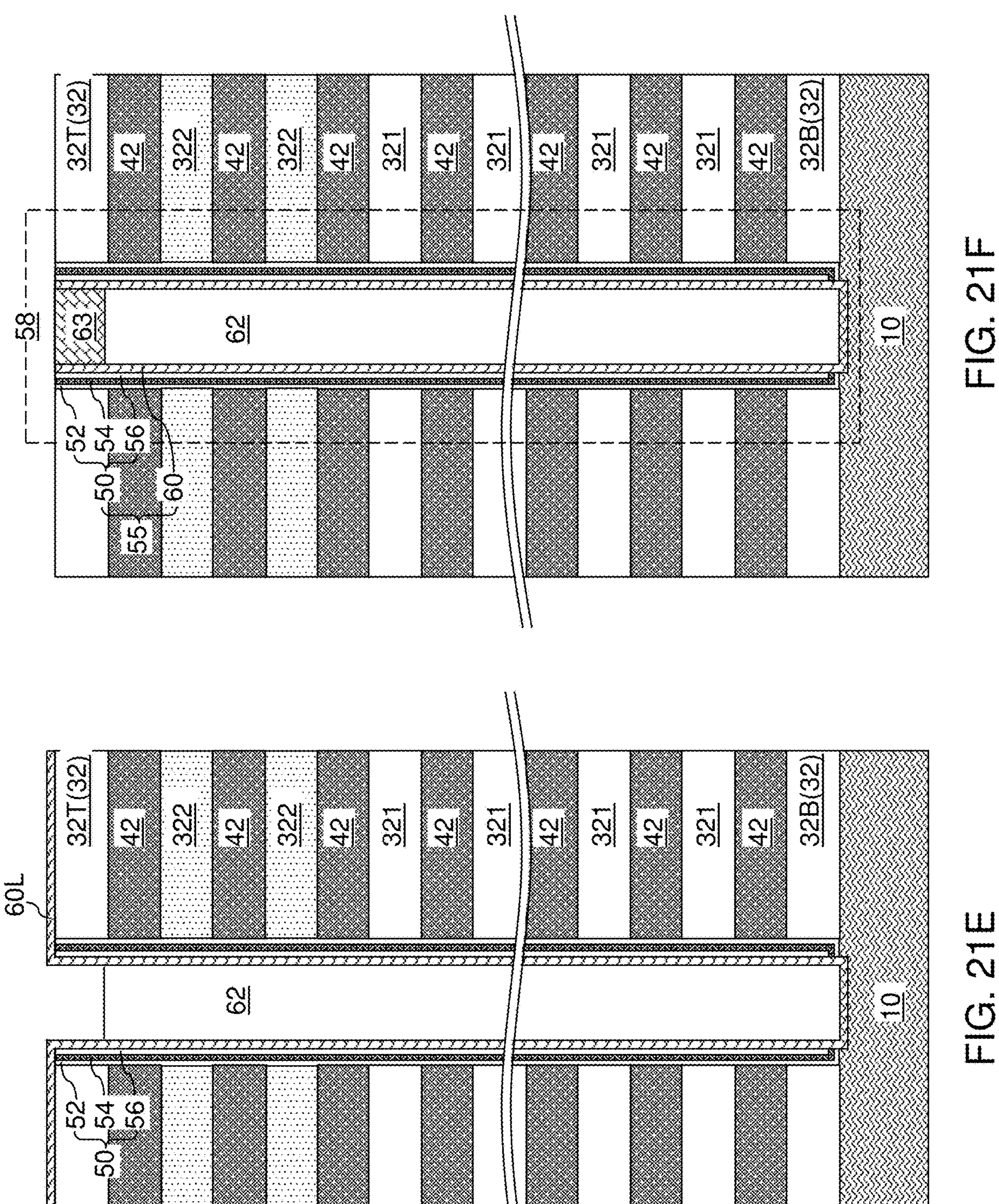

Referring to FIG. 21E, the processing steps described with reference to FIG. 17E can be performed to form a dielectric core 62 within each memory opening 49.

Referring to FIG. 21F, the processing steps described with reference to FIG. 17F can be performed to form a vertical semiconductor channel 60 and a drain region 63 within each memory opening 49.

Figure 22:
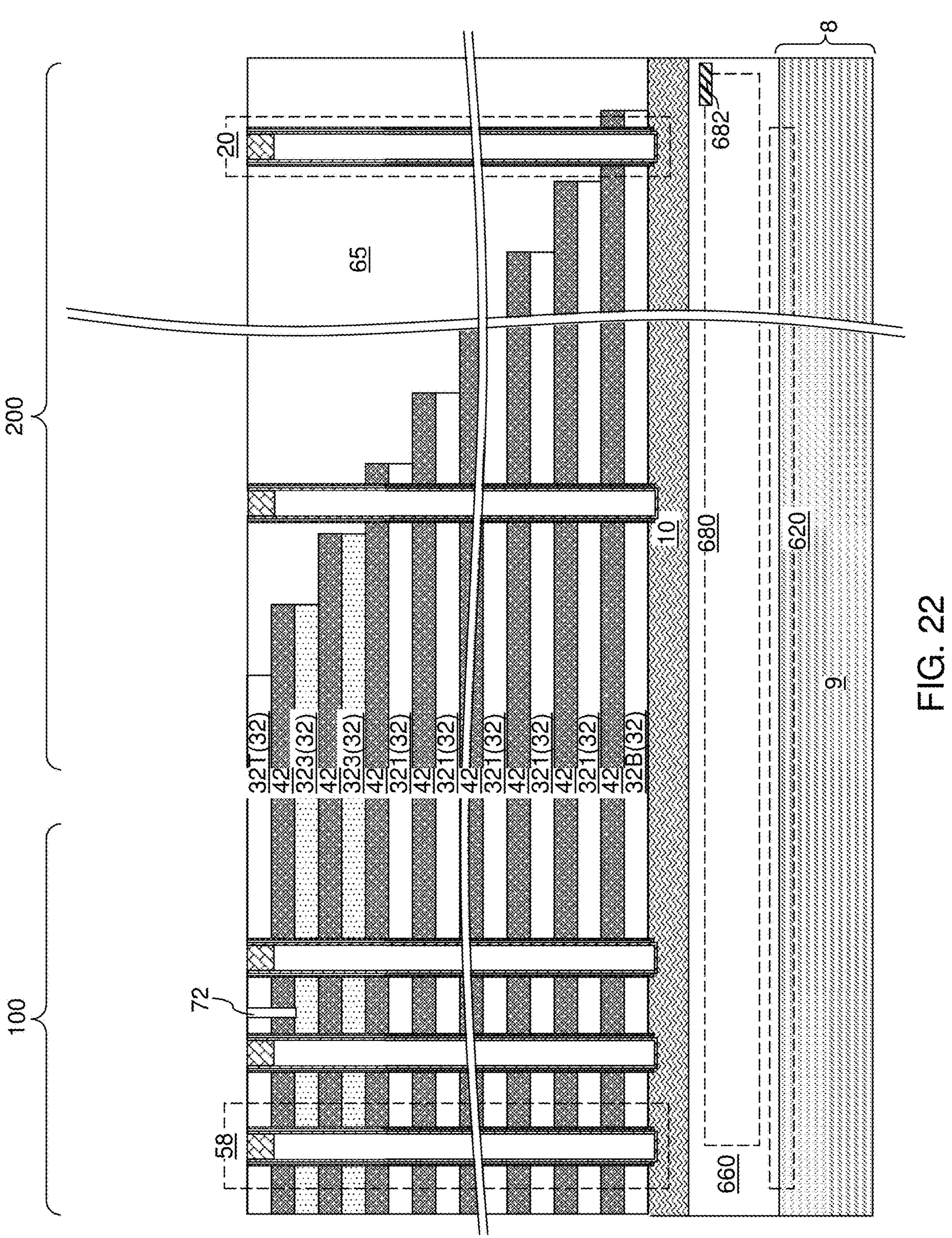
FIG. 22 is a vertical cross-sectional view of the third exemplary structure after formation of memory opening fill structures according to the third embodiment of the present disclosure.

Referring to FIG. 22, the third exemplary structure is illustrated after formation of memory opening fill structures 58 and support pillar structure 20 within the memory openings 49 and the support openings 19, respectively.

Figure 23:
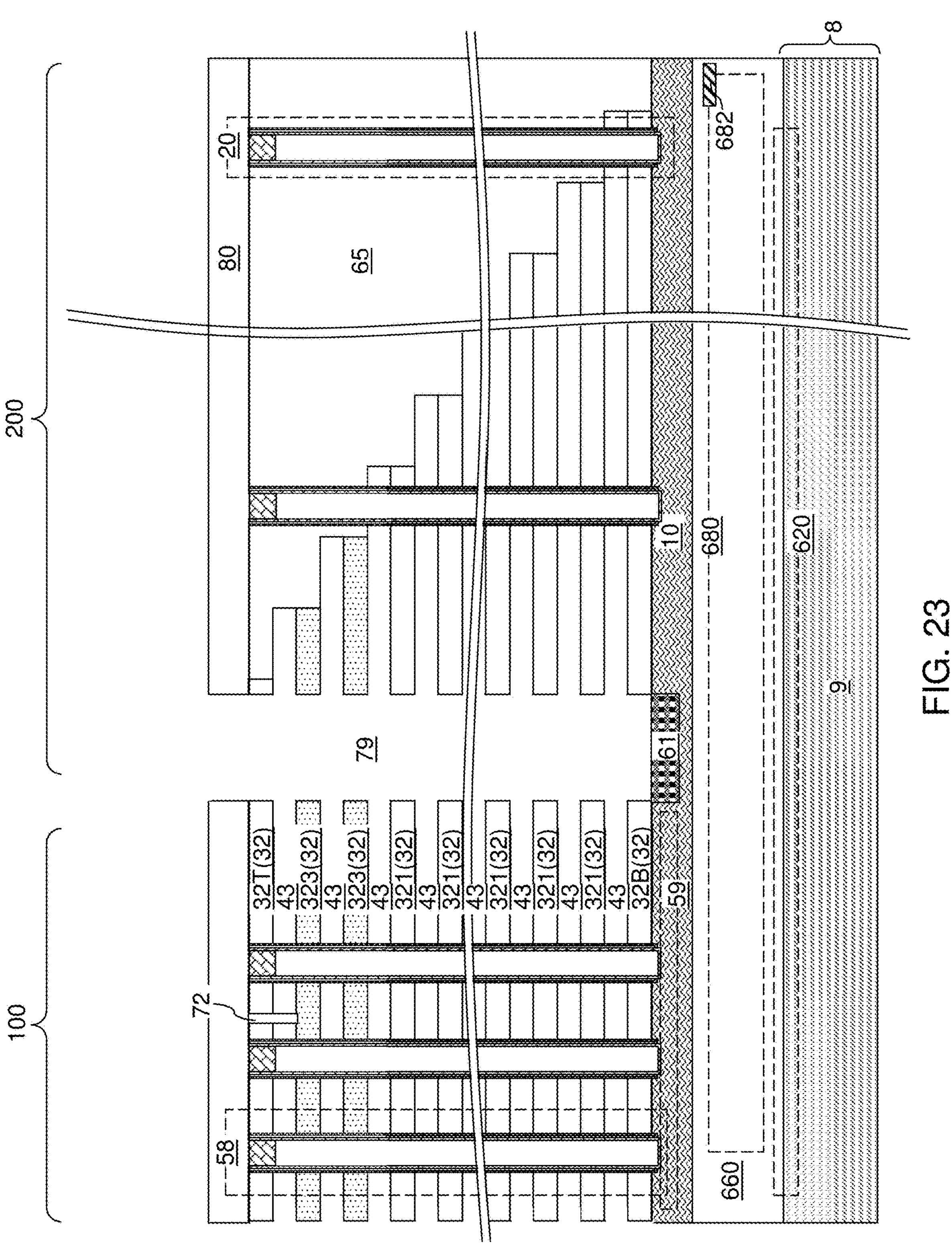
FIG. 23 is a vertical cross-sectional view of the third exemplary structure after formation of backside trenches and backside recesses according to the third embodiment of the present disclosure.

Referring to FIG. 23, the processing steps described with reference to FIGS. 8A, 8B, and 9 can be performed to form backside trenches 79, to form source regions 61, and to form backside recesses 43.

Figure 24A:
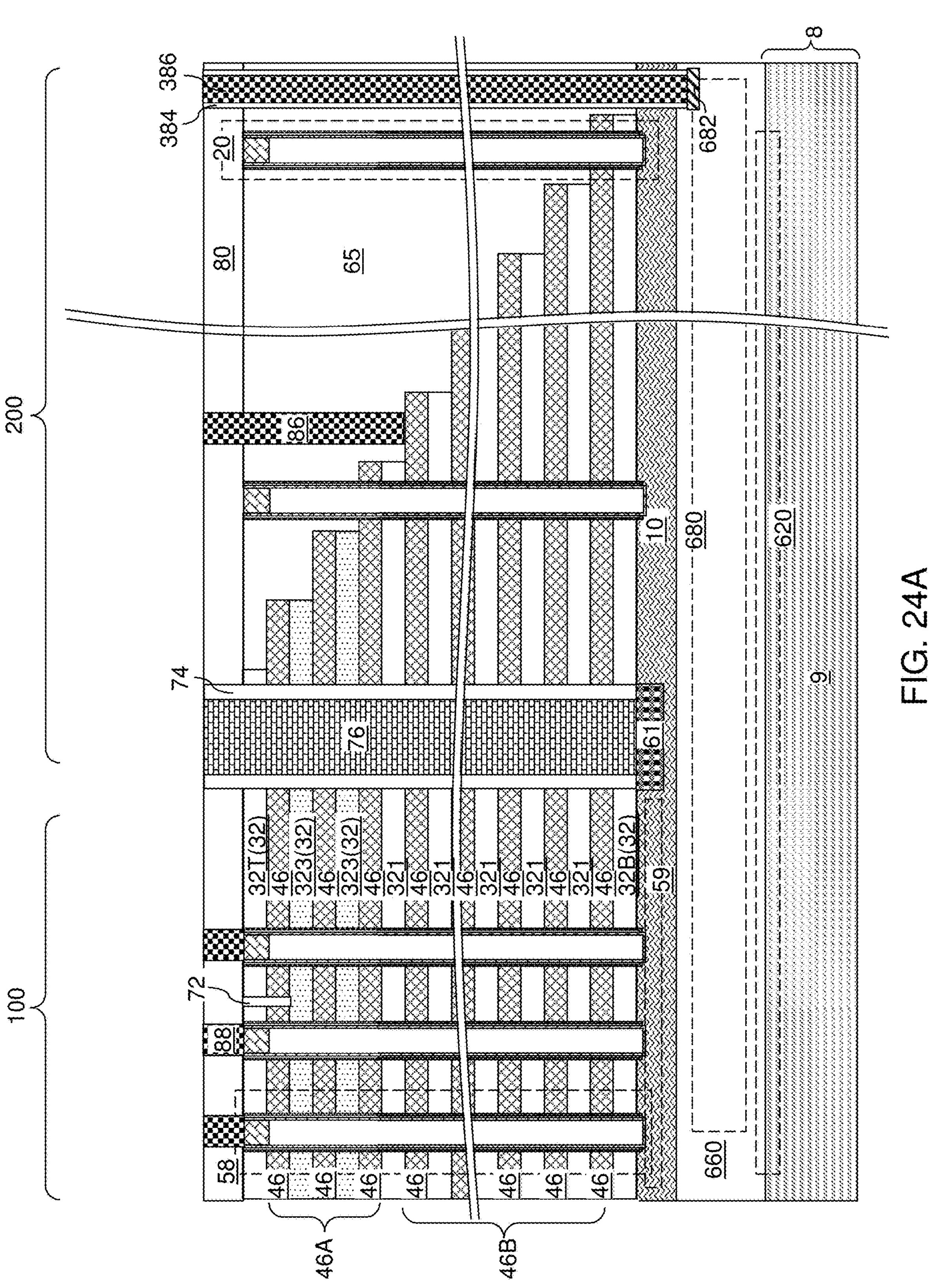
FIG. 24A is a vertical cross-sectional views of the third exemplary structure after formation of electrically conductive layers and various contact via structures according to the third embodiment of the present disclosure.
Figures 24B, 24C:
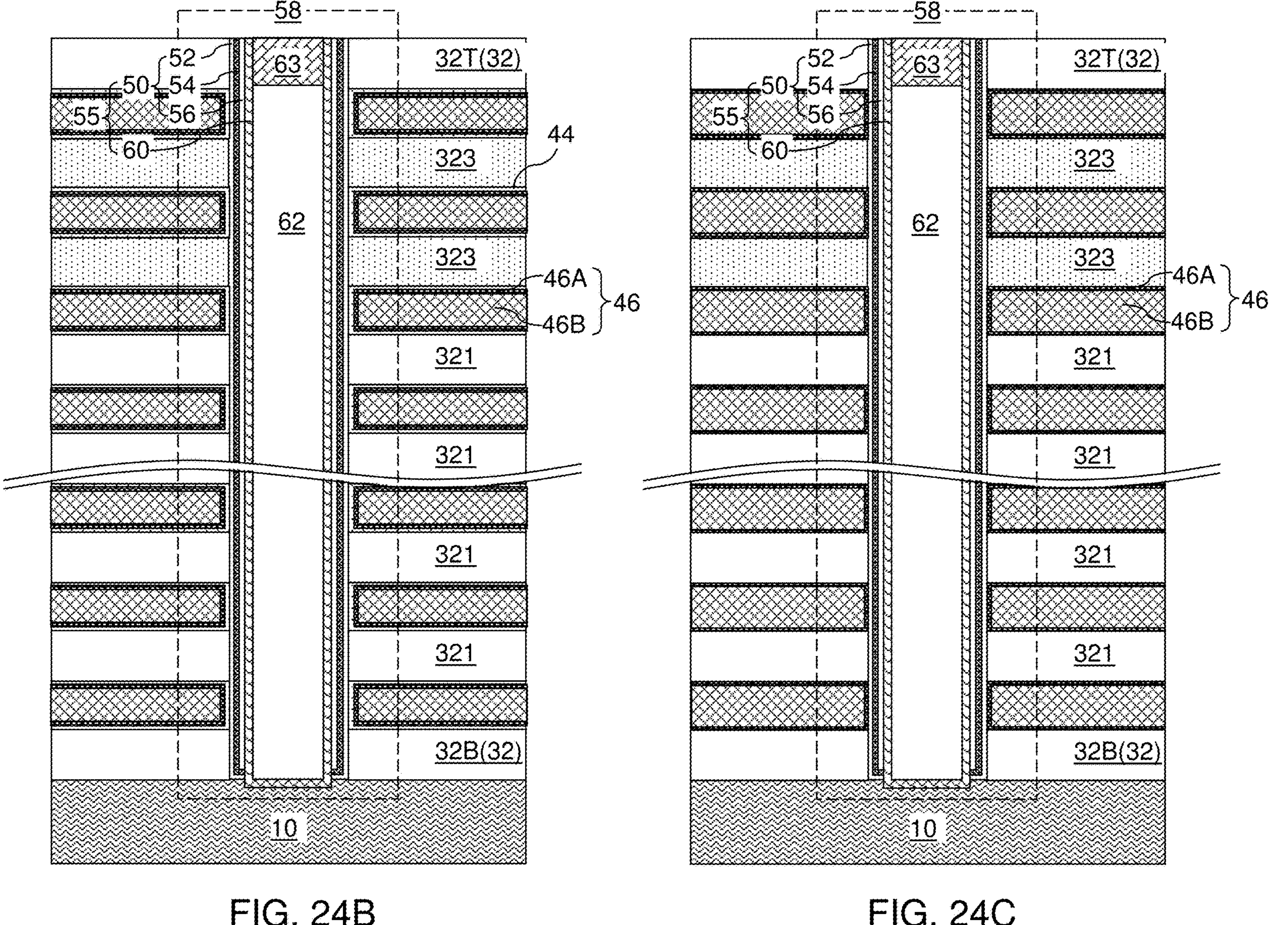
FIG. 24B is a magnified view of a region of a first configuration of the third exemplary structure after the processing steps of FIG. 24A.
FIG. 24C is a magnified view of a region of a second configuration of the third exemplary structure after the processing steps of FIG. 24A.

Referring to FIGS. 24A and 24B, the processing steps described with reference to FIGS. 10A and 10B, 11A and 11B, and 12A and 12B can be performed to form electrically conductive layers 46 in the backside recesses 43, to form backside trench fill structures (74, 76), and to form various contact via structures (86, 88, 386).

Referring to FIG. 24C, an alternative configuration of the third exemplary structure can be derived from the third exemplary structure by omitting formation of the backside blocking dielectric layer 44.

Generally, the memory device comprises an interference reduction feature for reducing NWI between vertically neighboring pairs of electrically conductive layers 46 of a first subset without providing the interference reduction feature for a second subset of the electrically conductive layers 46 that is a complement of the first subset. The first subset of the electrically conductive layers 46 is formed between, directly above or directly below the at least one second-type insulating layer 323. The second subset of the electrically conductive layers 46 comprises all electrically conductive layers 46 other than the first subset of the electrically conductive layers 46.

In the third exemplary structure, the neighboring electrically conductive layer interference reduction feature comprises the feature that each insulating layer 32 (i.e., the second-type insulating layer 323) located between a respective vertically neighboring pair of electrically conductive layers 46 of the first subset of the electrically conductive layers 46 comprises a dielectric material having a lower dielectric constant than a dielectric constant of any insulating layer 32 that is not located between a vertically neighboring pair of electrically conductive layers 46 of the first subset of the electrically conductive layers 46.

In one embodiment, the second-type insulating layer(s) 323 are not laterally recessed in the memory opening 49. In this embodiment, the each interface between the second-type insulating layer 323 and the memory opening fill structures 58 can be vertically coincident with an interface between a respective immediately overlying electrically conductive layers 46 of the first subset and the memory opening fill structure 58, and can be vertically coincident with an interface between a respective immediately underlying electrically conductive layers 46 of the first subset and the memory opening fill structure 58. In this embodiment, each of the memory opening fill structures 58 may have a respective straight sidewall that vertically extends from the horizontal plane including the topmost surface of the alternating stack (32, 46) to the horizontal plane including the bottommost surface of the alternating stack (32, 46).

In one alternative embodiment, the low dielectric constant second-type insulating layer(s) 323 of the third embodiment may be laterally recessed, as described above with respect to the first embodiment. Thus, the memory opening fill structures 58 may have a lateral outward protrusion at each level of the second-type insulating layer 323.

In another alternative embodiment, the low dielectric constant second-type insulating layer(s) 323 of the third embodiment may be located in a stack with the higher and low density silicon nitride layers (421, 422) as described above with respect to the second embodiment. Thus, the memory opening fill structures 58 may have a lateral outward protrusion at each level of the upper electrically conductive layers 46 which are located between, above or below the low dielectric constant second-type insulating layer(s) 323. In contrast, the middle and lower electrically conductive layers 46 are located between the high dielectric constant first-type insulating layers 321 and the memory opening fill structures 58 lack the lateral outward protrusion at each level of the middle and lower electrically conductive layers 46.

Referring to all drawings and according to various embodiments of the present disclosure, a memory device comprises an alternating stack (32, 46) of insulating layers 32 and electrically conductive layers 46; a memory opening 49 vertically extending through the alternating stack (32, 46); and a memory opening fill structure 58 located in the memory opening 49 and comprising a memory film 50 and a vertical semiconductor channel 60; and a neighboring electrically conductive layer interference reduction feature provided for a first subset 46A of the electrically conductive layers 46, such that a second subset 46B of the electrically conductive layers 46 lacks the neighboring electrically conductive layer interference reduction feature.

In one embodiment, the electrically conductive layers 46 of the first subset 46A are located above the electrically conductive layers 46 of the second subset 46B; and the electrically conductive layers 46 of the first subset 46A are thinner than the electrically conductive layers 46 of the second subset 46B.

In the first embodiment, the neighboring electrically conductive layer interference reduction feature comprises a lateral outward protrusion 58P of the memory opening fill structure 58 at each level of the electrically conductive layers 46 of the first subset 46A; and the memory opening fill structure lacks 58 the lateral outward protrusion 58P at each level of the electrically conductive layers 46 of the second subset 46B.

In the first embodiment, the memory film 50 comprises a plurality of discrete charge storage material layers 54 that are vertically spaced apart. The plurality of discrete charge storage material layers 54 comprises a first charge storage material layer 54B that vertically extends through only one of the electrically conductive layers 46 of the first subset 46A; and a second charge storage material layer 54C that vertically extends through a plurality of the electrically conductive layers 46 of the second subset 46B. The first charge storage material layer 54B is separated from the second charge storage material layer 54C in the lateral outward protrusion 58P.

In the first embodiment, the memory opening fill structure 58 further comprises a blocking dielectric layer 52 in direct contact with the insulating layers 32 and the electrically conductive layers 46, and in direct contact with the first and the second charge storage material layers (54B, 54C). The memory opening fill structure 58 further comprises a dielectric core 62 that is laterally surrounded by the vertical semiconductor channel 60 and comprising laterally-protruding dielectric material portions 62P that occupies a fraction of volumes of the lateral outward protrusions 58P.

In the second embodiment, the neighboring electrically conductive layer interference reduction feature comprises a lateral outward protrusion 58Q of the memory opening fill structure 58 located at each level of the insulating layers 32 which are located between the electrically conductive layers 46 of the first subset 46A; and the memory opening fill structure 58 lacks the lateral outward protrusion 58Q at each level of the insulating layers 32 located between the electrically conductive layers 46 of the second subset 46B.

In the second embodiment, the memory film 50 comprises a continuous charge storage material layer 54 that continuously extends through each of the electrically conductive layers 46 of the alternating stack; and the continuous charge storage material layer laterally extends outwards into the lateral outward protrusion 58Q.

In the third embodiment, the neighboring electrically conductive layer interference reduction feature comprises each of the insulating layers 322 (e.g., porous silicon oxide layers having a dielectric constant less than 3.7) located between a respective vertically neighboring pair of the electrically conductive layers 46 of the first subset 46A which have a lower dielectric constant than each of the insulating layers (e.g., non-porous silicon oxide layers) 321 located between a respective vertically neighboring pair of the electrically conductive layers 46 of the second subset 46B.

The various embodiments of the present disclosure may be employed to selectively reduce NWI of a first subset of the electrically conductive layers 46 without reducing NWI of a second subset of the electrically conductive layers 46, which may be thicker than the electrically conductive layers 46 of the first subset. Thus, the NWI is reduced for the thinner (e.g., upper) electrically conductive layers 46 which may suffer from higher NWI than the thicker (e.g., middle or lower) electrically conductive layers 46.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:

an alternating stack of insulating layers and electrically conductive layers;

a memory opening vertically extending through the alternating stack;

a memory opening fill structure located in the memory opening and comprising a memory film and a vertical semiconductor channel; and a neighboring electrically conductive layer interference reduction feature provided for a first subset of the electrically conductive layers, wherein a second subset of the electrically conductive layers lacks the neighboring electrically conductive layer interference reduction feature;

wherein;

the neighboring electrically conductive layer interference reduction feature comprises a lateral outward protrusion of the memory opening fill structure at each level of the electrically conductive layers of the first subset;

the memory opening fill structure lacks the lateral outward protrusion at each level of the electrically conductive layers of the second subset;

the memory film comprises a plurality of discrete charge storage material layers that are vertically spaced apart; and the plurality of discrete charge storage material layers comprises:

a first charge storage material layer that vertically extends through only one of the electrically conductive layers of the first subset; and a second charge storage material layer that vertically extends through a plurality of the electrically conductive layers of the second subset.

2. The memory device of claim 1, wherein the first charge storage material layer is separated from the second charge storage material layer in the lateral outward protrusion.

3. A memory device, comprising:

an alternating stack of insulating layers and electrically conductive layers;

a memory opening vertically extending through the alternating stack;

a memory opening fill structure located in the memory opening and comprising a memory film and a vertical semiconductor channel; and a neighboring electrically conductive layer interference reduction feature provided for a first subset of the electrically conductive layers, wherein a second subset of the electrically conductive layers lacks the neighboring electrically conductive layer interference reduction feature;

wherein:

the neighboring electrically conductive layer interference reduction feature comprises a lateral outward protrusion of the memory opening fill structure at each level of the electrically conductive layers of the first subset;

the memory opening fill structure lacks the lateral outward protrusion at each level of the electrically conductive layers of the second subset; and the memory opening fill structure further comprises a blocking dielectric layer in direct contact with the insulating layers and the electrically conductive layers, and in direct contact with the first and the second charge storage material layers.

4. The memory device of claim 3, wherein the memory opening fill structure further comprises a dielectric core that is laterally surrounded by the vertical semiconductor channel and comprising laterally-protruding dielectric material portions that occupies a fraction of volumes of the lateral outward protrusions.

* * * * *